US012812831B2

(12) United States Patent
Ito et al.

(10) Patent No.: US 12,812,831 B2
(45) Date of Patent: Nov. 24, 2026

(54) WIRE HARNESS

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Hideaki Ito, Osaka (JP); Daisuke Miyawaki, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 16 days.

(21) Appl. No.: 18/853,530

(22) PCT Filed: Mar. 24, 2023

(86) PCT No.: PCT/JP2023/011789
§ 371 (c)(1),
(2) Date: Oct. 2, 2024

(87) PCT Pub. No.: WO2023/195357
PCT Pub. Date: Oct. 12, 2023

(65) Prior Publication Data

US 2025/0275108 A1 Aug. 28, 2025

(30) Foreign Application Priority Data

Apr. 8, 2022 (JP) ................................. 2022-064438

(51) Int. Cl.
*H05K 9/00* (2006.01)
*B60R 16/02* (2006.01)
(Continued)

(52) U.S. Cl.
CPC ....... *H05K 9/0098* (2013.01); *B60R 16/0215* (2013.01); *H01B 7/0045* (2013.01);
(Continued)

(58) Field of Classification Search
CPC .................................................... H05K 9/0098
See application file for complete search history.

(56) References Cited

U.S. PATENT DOCUMENTS

| | | | | |
|---|---|---|---|---|
| 10,023,136 | B2 * | 7/2018 | Oka | H01B 7/0063 |
| 2021/0134482 | A1 | 5/2021 | Tanaka et al. | |
| 2021/0225555 | A1 * | 7/2021 | Mizushita | H01B 13/01209 |

FOREIGN PATENT DOCUMENTS

| | | |
|---|---|---|
| CN | 109756102 | 5/2019 |
| JP | 2003-332136 | 11/2003 |

(Continued)

OTHER PUBLICATIONS

Office Action issued in Japan Patent Application No. 2022-64438, dated Jun. 24, 2025, together with English translation thereof.

(Continued)

*Primary Examiner* — Hung V Ngo
(74) *Attorney, Agent, or Firm* — Greenblum & Bernstein, P.L.C.

(57) ABSTRACT

A wire harness includes: a plurality of wirings; a base member keeping the plurality of wirings in a flat state; and a magnetic core positioned on the base member and covering a target wiring in the plurality of wirings.

10 Claims, 13 Drawing Sheets

(51) Int. Cl.
*H01B 7/00* (2006.01)
*H01R 24/20* (2011.01)
*H02G 3/04* (2006.01)

(52) U.S. Cl.
CPC ........... *H01R 24/20* (2013.01); *H02G 3/0437* (2013.01); *H02G 3/0481* (2013.01)

(56) References Cited

FOREIGN PATENT DOCUMENTS

| | | |
|---|---|---|
| JP | 2007-5703 | 1/2007 |
| JP | 2007-202352 | 8/2007 |
| JP | 2021-72388 | 5/2021 |

OTHER PUBLICATIONS

International Search Report issued in International Patent Application No. PCT/JP2023/011789, dated Jun. 13, 2023, along with an English translation thereof.
International Preliminary Report on Patentability issued in International Patent Application No. PCT/JP2023/011789, dated Oct. 17, 2024, along with an English translation thereof.
Office Action issued in Japan Patent Application No. 2025-136744 on Sep. 29, 2026, together with English translation thereof.

* cited by examiner

6/13

WIRE HARNESS

TECHNICAL FIELD

The present disclosure relates to a wire harness.

BACKGROUND ART

Patent Document 1 discloses an interconnection box electrically interconnecting an instrument panel harness, an engine room harness, a door harness, and a floor harness.

PRIOR ART DOCUMENTS

Patent Document(S)

Patent Document 1: Japanese Patent Application Laid-Open No. 2007-202352

SUMMARY

Problem to be Solved by the Invention

Countermeasures against noise are required for a wire harness in some cases.

Accordingly, an object is to be able to simply perform countermeasures against noise on a wire harness.

Means to Solve the Problem

A wire harness according to the present disclosure is a wire harness including: a plurality of wirings; a base member keeping the plurality of wirings in a flat state; and a magnetic core positioned on the base member and covering a target wiring in the plurality of wirings.

Effects of the Invention

According to the present disclosure, countermeasures against noise can be simply performed on the wire harness.

DESCRIPTION OF EMBODIMENT(S)

Description of Embodiments of Present Disclosure

Figure 1:
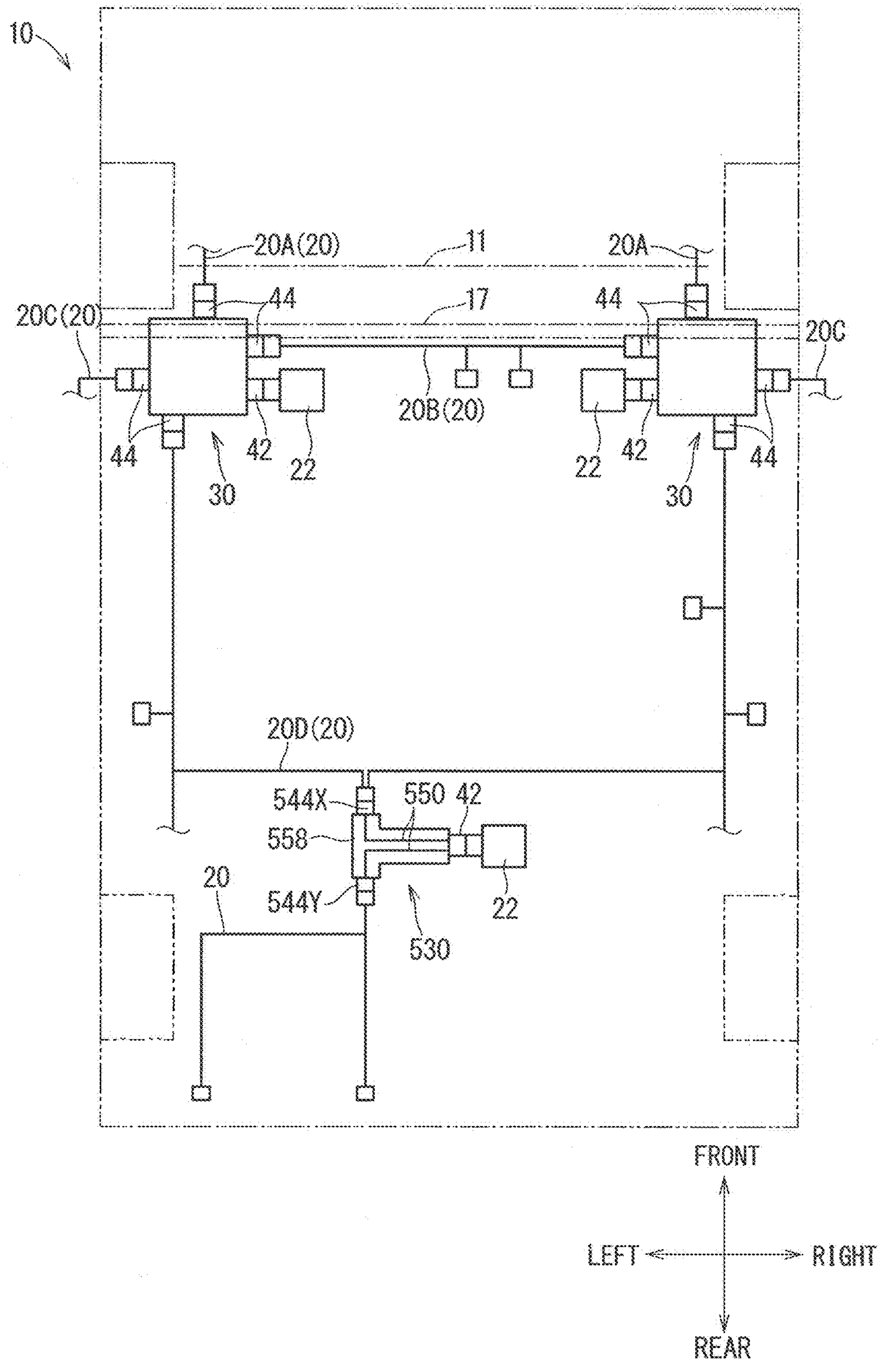
FIG. 1 is an explanation view illustrating a wiring system including a wire harness in a vehicle.

Embodiments of the present disclosure are listed and described firstly.

A wire harness of according to the present disclosure is as follows.

(1) A wire harness includes: a plurality of wirings; a base member keeping the plurality of wirings in a flat state; and a magnetic core positioned on the base member and covering a target wiring in the plurality of wirings.

According to such a wire harness, countermeasures against noise can be performed on the target wiring by the magnetic core positioned on the base member keeping the plurality of wirings including the target wiring in the flat state. Accordingly, countermeasures against noise can be simply performed on the wire harness.

(2) In the wire harness according to (1), it is applicable that the base member is a protector including a body in which a groove housing the target wiring is formed and a cover covering the target wiring from a side opposite to the body, and the magnetic core is housed in the groove. Accordingly, the magnetic core can be simply positioned on the protector as the base member.

(3) In the wire harness according to (1), it is applicable that the base member is a sheet member having flexibility, slits are formed on both sides of the target wiring in the sheet member, and the magnetic core covers a part between the slits in the sheet member together with the target wiring. Accordingly, the magnetic core can be simply positioned on the sheet member as the base member.

(4) In the wire harness according to any one of (1) to (3), it is applicable that an apparatus connector connected to a connector of an electrical apparatus and a first harness connector and a second harness connector to which connectors of counterpart wire harnesses are connected, respectively, are provided, the plurality of wirings include a plurality of apparatus wirings branched from the apparatus connector to be connected to the first harness connector and the second harness connector, and the target wiring includes a power source wire in the plurality of apparatus wirings. Accordingly, countermeasures against noise can be simply performed on the power source wire connected to the electrical apparatus.

(5) In the wire harness according to (4), it is applicable that the electrical apparatus distributes electrical power supplied from a power source of a vehicle, a first power source wire connecting the first harness connector and the apparatus connector in the power source wire supplies the electrical power from the power source to the electrical apparatus, and the magnetic core includes a first magnetic core covering the first power source wire. Accordingly, countermeasures against noise can be simply performed on the first power source wire supplying the electrical power from the power source to the electrical apparatus.

(6) In the wire harness according to (4) or (5), it is applicable that the electrical apparatus distributes electrical power supplied from a power source of a vehicle, a second power source wire connecting the second harness connector and the apparatus connector in the power source wire supplies the electrical power from the electrical apparatus to a load of the vehicle, and the magnetic core includes a second magnetic core covering the second power source wire. Accordingly, countermeasures against noise can be simply performed on the second power source wire supplying the electrical power from the electrical apparatus to the load.

Detailed Description of Embodiment of Present Disclosure

Specific examples of a wire harness of the present disclosure are described hereinafter with reference to the diagrams. The present disclosure is not limited to these examples, but is indicated by claims, and it is intended that meanings equivalent to claims and all modifications within a scope of claims are included.

Embodiment 1

Figure 2:
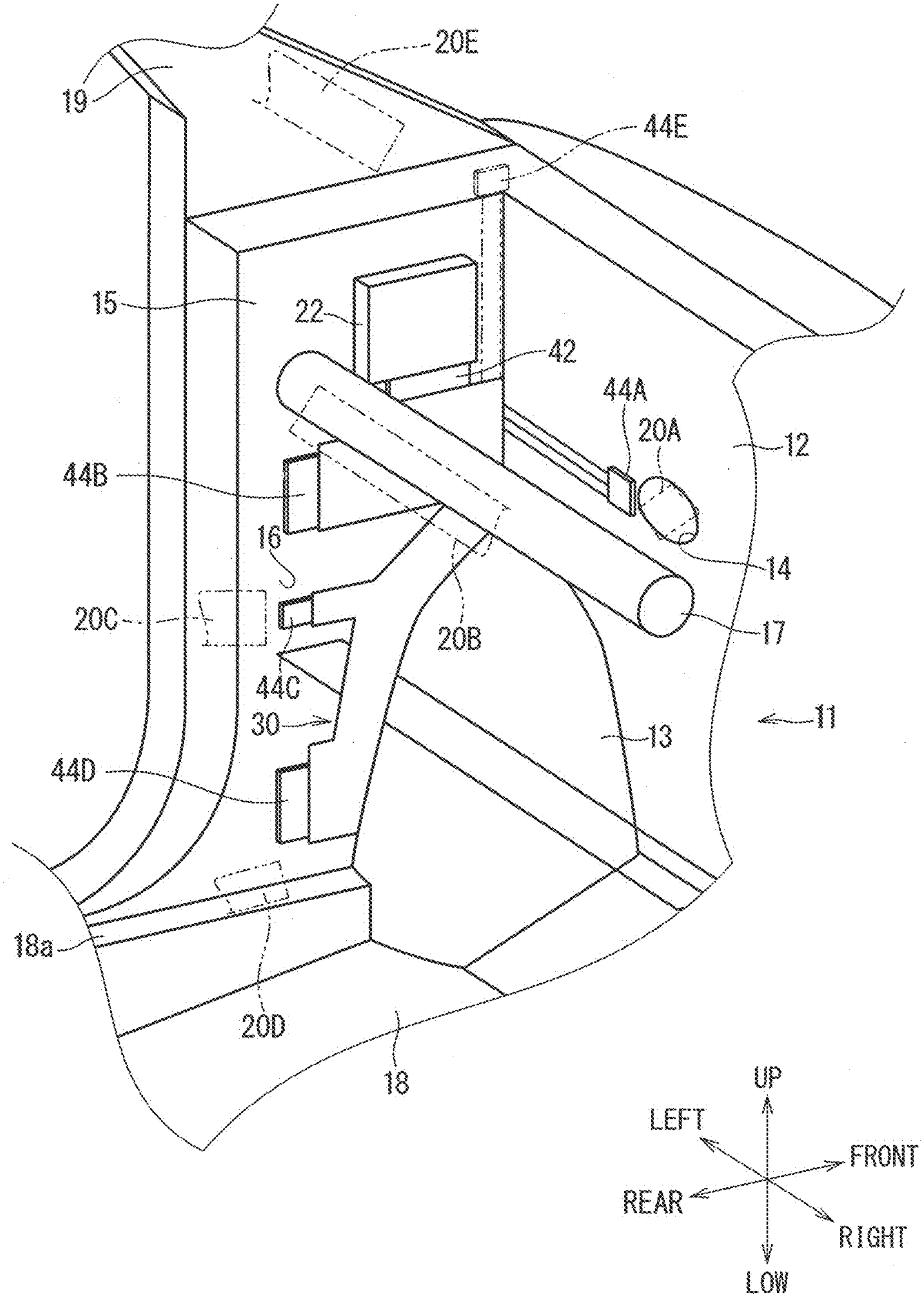
FIG. 2 is a perspective view illustrating a state where a wire harness according to an embodiment is disposed in a vehicle.
Figure 3:
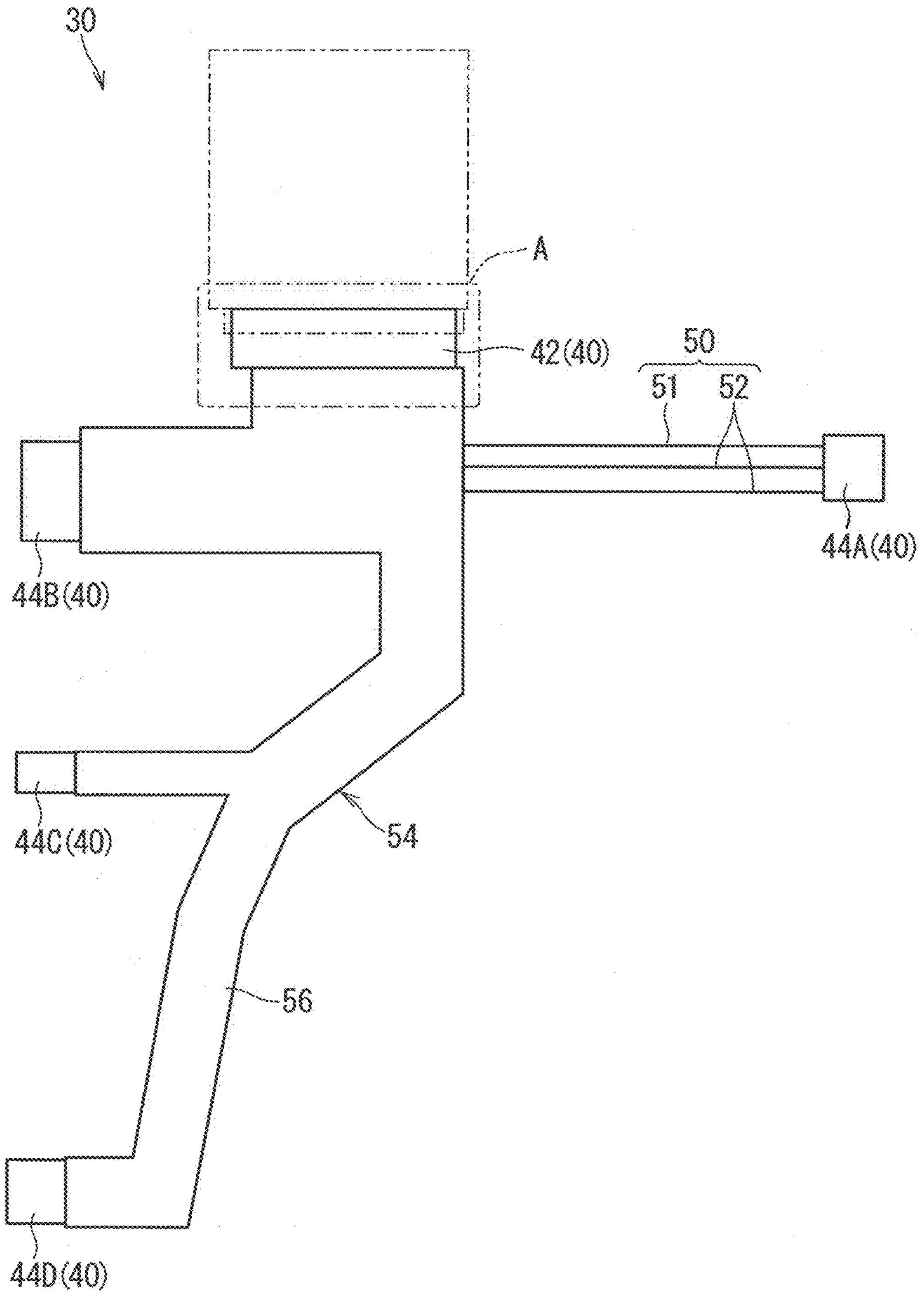
FIG. 3 is a plan view illustrating the wire harness according to the embodiment.
Figure 4:
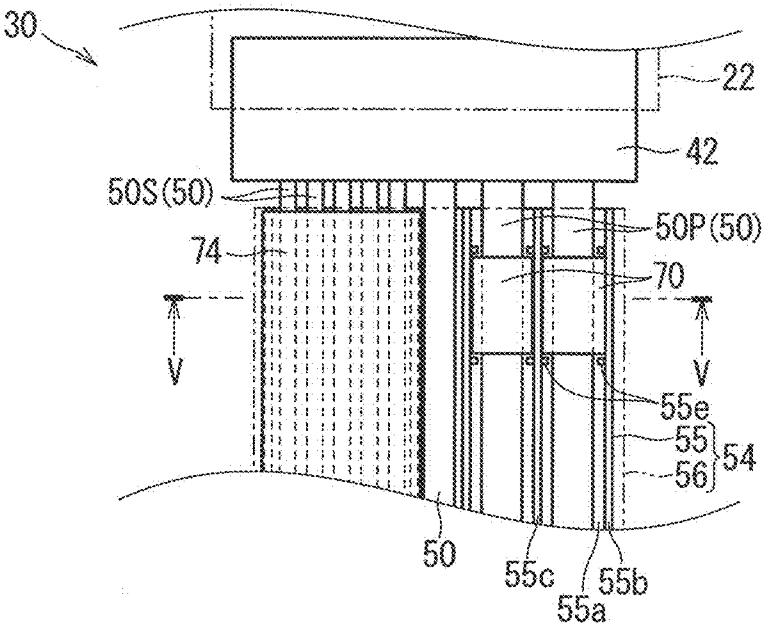
FIG. 4 is an enlarged view of a region A in FIG. 3.
Figure 5:
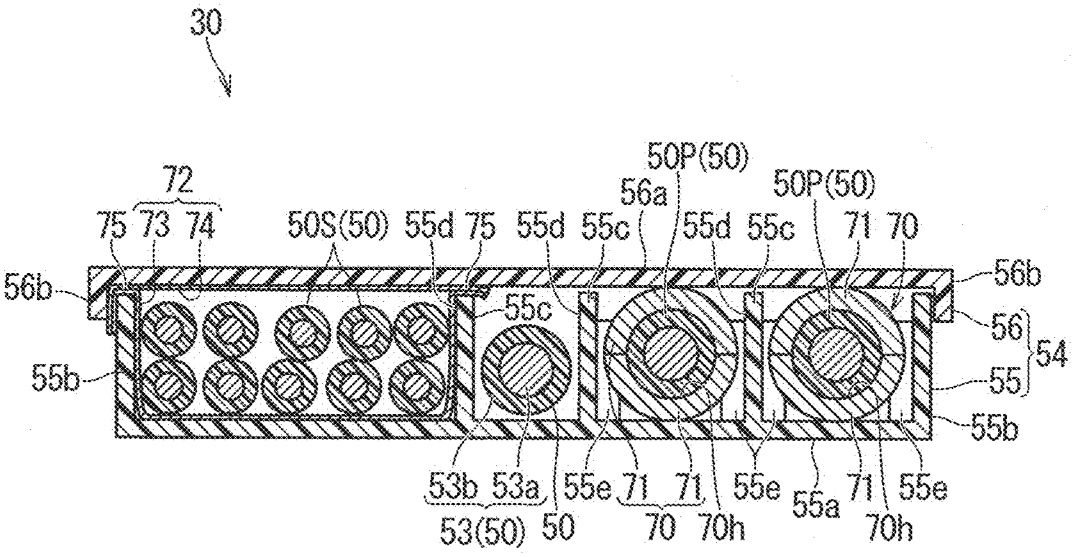
FIG. 5 is a cross-sectional view along a V-V line in FIG. 4.

A wire harness according to an embodiment 1 is described hereinafter. FIG. 1 is an explanation view illustrating a wiring system including a wire harness 30 in a vehicle 10. FIG. 2 is a perspective view illustrating a state where the wire harness 30 according to an embodiment is disposed in the vehicle 10. A front-back direction (FRONT, REAR), a 15 right-left direction (RIGHT, LEFT), and an up-down direction (UP, LOW) illustrated in FIG. 2 correspond to a front-back direction, a right-left direction, and an up-down direction in the vehicle 10, respectively. FIG. 3 is a plan view illustrating the wire harness 30 according to the embodiment. FIG. 4 is an enlarged view of a region A in FIG. 3. FIG. 5 is a cross-sectional view along a V-V line in FIG. 4. A cover 56 of a protector 54 is illustrated by a dash-double-dot line in FIG. 4.

Whole Configuration of Wire Harness

The wire harness 30 is disposed in the vehicle 10, for example. The wire harness 30 intervenes between plural types of counterpart wire harnesses 20 and an electrical apparatus 22 to connect each of the plural types of counterpart wire harnesses 20 and the electrical apparatus 22. The plural types of counterpart wire harnesses 20 are disposed in areas different from each other in the vehicle 10. The wire harness 30 illustrated in FIG. 2 also connects the plural types of counterpart wire harnesses 20. The wire harness 30 includes a plurality of wirings 50, a base member 54, and noise countermeasure components 70 and 72.

The plurality of wirings 50 include an apparatus wiring 51 for connecting each of the plural types of the counterpart wire harnesses 20 and the electrical apparatus 22. One end portion of the apparatus wiring 51 is connected to the counterpart wire harness 20, and the other end portion thereof is connected to the electrical apparatus 22. In the present embodiment, included as the wiring 50 of the wire harness 30 is a through circuit wiring 52 for connecting the plural types of the counterpart wire harnesses 20. One end portion and the other end portion of the through circuit wiring 52 are connected to the counterpart wire harnesses 20 different from each other, respectively. The plurality of wirings 50 are held along a flat route by the base member 54. The wire harness 30 has a flat form as a whole. The wire harness 30 has the flat form, thus can be easily disposed along one main surface of a panel.

The base member 54 is a member keeping the plurality of wirings 50 in the flat form. The base member 54 may be a member protecting the plurality of wirings 50. The base member 54 may be formed into a branched or bended shape in accordance with a connection position between the wire harness 30 and the electrical apparatus 22, a connection position between the wire harness 30 and the counterpart wire harness 20, and a route of the wiring 50 between these connection positions.

The noise countermeasure components 70 and 72 covers a target wiring in the plurality of wirings 50. The noise countermeasure components 70 and 72 are positioned on the base member 54. The noise countermeasure components 70 and 72 include a magnetic core 70 and a metal foil 72. A target wiring of the magnetic core 70 and a target wiring of the metal foil 72 are different from each other. In the present embodiment, the target wiring of the magnetic core 70 is a power source wire 50P, and the target wiring of the metal foil 72 is a signal wire 50S.

The magnetic core 70 is attached to the power source wire 50P to reduce electromagnetic waves radiated from the power source wire 50P. The magnetic core 70 is a member including a magnetic material and molded into a block-like shape. The magnetic core 70 includes a through hole 70*h*. The power source wire 50P is inserted into the through hole 70*h*. Accordingly, an inner peripheral surface of the through hole 70*h* of the magnetic core 70 and an outer peripheral surface of the power source wire 50P face each other. The magnetic core 70 including the magnetic material absorbs the electromagnetic waves radiated from the power source wire 50P, and converts energy of the electromagnetic waves into mechanical energy if vibration or heat energy, for example. Accordingly, negative influence of the electromagnetic waves radiated from the power source wire 50P on a surrounding apparatus, for example, is reduced. The electromagnetic material of the magnetic core 70 is ferrite or silicon steel, for example, and can be appropriately selected in accordance with a frequency band of magnetic noise to be reduced. For example, the magnetic core 70 is formed into a cylindrical shape.

The metal foil 72 is attached to the signal wire 50S, and serves as an electromagnetic shield of the signal wire 50S. The metal foil 72 is a member including a metal material such as aluminum or copper and molded into a sheet-like shape with plasticity. The metal foil 72 is bended to surround the signal wire 50S.

Arrangement Area and Connection Relationship of Wire Harness

Examples of an arrangement area of the wire harness 30 in the vehicle 10, the counterpart wire harness 20, and the electrical apparatus 22 are firstly described for a purpose of convenience.

The arrangement area of the wire harness 30 in the vehicle 10 is not particularly limited, but can be appropriately set.

From a viewpoint that the wire harness 30 intervenes between the plural types of counterpart wire harnesses 20, the arrangement area of the wire harness 30 is preferably an area close to a boundary between a plurality of areas where the plural types of counterpart wire harnesses 20 are disposed, respectively. In the description herein, the arrangement area of the wire harness 30 is an area where a dashboard panel 11 and a cowl side panel 15 intersect with each other.

The dashboard panel 11 partitions an engine room and a vehicle interior in the vehicle 10. An area closer to the front side than the dashboard panel 11 is the engine room, and an area closer to a rear side than the dashboard panel 11 is the vehicle interior. An instrument panel is normally provided closer to the rear side than the dashboard panel 11, and the instrument panel is exposed to the vehicle interior. The dashboard panel 11 includes a body part 12 and a protrusion part 13. A main surface of the body part 12 of the dashboard panel 11 extends in the right-left direction and an up-down direction in the vehicle 10. The protrusion part 13 is provided on a lower side of an end portion of the body part 12 in the right-left direction. The protrusion part 13 a part protruding to a side of the vehicle interior from the body part 12. The protrusion part 13 is a part for providing a wheel house to the vehicle 10.

The cowl side panel 15 is continuously formed with the dashboard panel 11 in each of a left side and a right side of the dashboard panel 11. A main surface of the cowl side panel 15 extends in the front-back direction and the up-down direction in the vehicle 10. FIG. 2 illustrates an area where the cowl side panel 15 provided on the left side of the dashboard panel 11 and the dashboard panel 11 intersect with each other. An edge portion on a lower front side of the cowl side panel 15 is bended in accordance with the protrusion part 13.

An end portion of an instrument panel reinforcement 17 is fixed to the cowl side panel 15. The instrument panel reinforcement 17 is provided between the dashboard panel 11 and the instrument panel. The instrument panel reinforcement 17 is a rod-like member elongated in the right-left direction.

A floor panel 18 is provided on a lower side of the area where the dashboard panel 11 and the cowl side panel 15 intersect with each other. A main surface of the floor panel 18 extends in the front-back direction and the right-left direction in the vehicle 10.

When the arrangement area of the wire harness 30 is the area where the dashboard panel 11 and the cowl side panel 15 intersect with each other, assumed as the counterpart wire harnesses 20 are the engine room harness 20A, the instrument panel harness 20B, the door harness 20C, and the floor harness 20D, for example. The engine room harness 20A is disposed in an engine room. The instrument panel harness 20B is disposed to extend along the instrument panel reinforcement 17. The door harness 20C is disposed in a door. The floor harness 20D is disposed along a floor. A roof harness 20E may be assumed as the counterpart wire harness 20. The roof harness 20E is disposed in a roof.

In the present disclosure, a term of engine room is an expediential address term of a front room located in front of a vehicle interior, thus an engine needs not necessarily be disposed in the engine room. In the similar manner, in the present disclosure, a term of the engine room harness 20A is an expediential address term of the counterpart wire harness 20 disposed in the front room located in front of the vehicle interior.

The arrangement area of the wire harness 30 and the arrangement area of the engine room harness 20A are partitioned by the dashboard panel 11. Herein, a through hole 14 is formed in the dashboard panel 11. The wire harness 30 and the engine room harness 20A are connected through the through hole 14. In the similar manner, the arrangement area of the wire harness 30 and the arrangement area of the door harness 20C are partitioned by the cowl side panel 15. Herein, a through hole 16 is formed in the cowl side panel 15. The wire harness 30 and the door harness 20C are connected through the through hole 16. A rocker part 18*a,* for example, is located in a side edge of the floor panel 18 in the vehicle. An end portion of the floor harness 20D connected to the wire harness 30 extends in the front-back direction of the vehicle along the rocker part 18*a*. The roof is located on an upper side of the area where the dashboard panel 11 and the cowl side panel 15 intersect with each other. For example, an end portion of the roof harness 20E connected to the wire harness 30 extends from the roof to the area where the dashboard panel 11 the cowl side panel 15 intersect with each other or near the area along an A pillar 19.

Electrical Apparatus

The electrical apparatus 22 is disposed in the same area as the arrangement area of the wire harness 30. In the example illustrated in FIG. 2, the electrical apparatus 22 is fixed to the cowl side panel 15. The electrical apparatus 22 may be fixed to the dashboard panel 11, the instrument panel reinforcement 17, or the floor panel 18, for example.

The electrical apparatus 22 is an electrical control unit (ECU), for example. One central ECU and a plurality of zone ECUs may be provided in the vehicle 10. The zone ECU is provided for each zone sectioned into a plurality of areas in the vehicle 10. The zone ECU mainly controls the apparatus located in the zone. The central ECU achieves control of summing up the plurality of zone ECUs and collaborating in the whole vehicle 10. The electrical apparatus 22 may be the zone ECU, for example. In this case, the electrical apparatus 22 as the zone ECU controls a plurality of apparatuses as connection destinations of the engine room harness 20A, the instrument panel harness 20B, the door harness 20C, and the floor harness 20D, for example.

The electrical apparatus 22 as the ECU may be a general ECU other than the zone ECU. The electrical apparatus 22 needs not be the ECU, but may be a junction block (also referred to as an electrical junction box), for example.

The electrical apparatus 22 according to the present embodiment distributes electrical power supplied from a power source of the vehicle. For example, the engine room harness 20A is connected to a power source such as a battery of the vehicle. The electrical apparatus 22 is connected to the power source such as the battery of the vehicle via the wire harness 30 and the engine room harness 20A to receive the electrical power from the battery. Then, the electrical apparatus 22 supplies the electrical power to a load (for example, an instrument or a switch) connected to the instrument panel harness 20B via the wire harness 30 and the instrument panel harness 20B. In the similar manner, the electrical apparatus 22 supplies the electrical power to a load connected to the door harness 20C and a load connected to the floor harness 20D.

The electrical apparatus 22 includes an electrical power distribution circuit for distributing the electrical power supplied from the power source of the vehicle. The electrical power distribution circuit includes an electrical wire or a conductor wire part such as a pattern of a circuit substrate. The electrical power distribution circuit may include a circuit component connected to the conductor wire part. The circuit component may be an electromagnetic relay, a semiconductor switch, a fuse, or an integrated circuit (IC), for example. The electrical apparatus 22 may include a case housing the electrical power distribution circuit. A connector may be provided to the case. The electrical power distribution circuit in the case and the wire harness 30 may be connected via a connector provided to the case.

Wire Harness

In the present embodiment, the wire harness 30 further includes plural types of connectors 42 and 44 in addition to the wiring 50, the base member 54, and the noise countermeasure components 70 and 72.

The plural types of connectors 42 and 44 are connected to connection destinations different from each other, respectively. The plural types of connectors 42 and 44 are disposed in positions corresponding to connection positions where the connectors 42 and 44 are connected to the electrical apparatus 22 and the counterpart wire harness 20 as the connection destinations, respectively.

The connectors 42 and 44 are connected to a plurality of end portions of the wirings 50, respectively. The wiring 50 is connected to the electrical apparatus 22 via the connector 42, and is connected to the counterpart wire harness 20 via the connector 44. The wiring 50 needs not be connected to the electrical apparatus 22 and the counterpart wire harness 20 via the connectors 42 and 44. At least some of the wirings 50 may be a wiring directly led out from the electrical apparatus 22 or a wiring directly connected to a wiring of the counterpart wire harness 20.

In the present embodiment, the wiring 50 is an electrical wire 53. The electrical wire 53 includes a core wire 53*a* and a covering 53*b* covering the core wire 53*a*. The electrical wire 53 is a single wire in which one covering 53*b* covers one core wire 53*a*. The electrical wire may be a composite wire in which one covering covers a plurality of core wires. The wiring 50 includes the power source wire 50P and the signal wire 50S. A conductor cross-sectional area of the power source wire 50P may be larger than that of the signal wire 50S. The electrical wire 53 used as the power source wire 50P may be thicker than the electrical wire 53 used as the signal wire 50S. When the plurality of wirings 50 include the plurality of power source wires 50P having conductor cross-sectional areas different from each other, the magnetic core 70 may be attached to the power source wire 50P having a largest conductor cross-sectional area in the plurality of power source wires 50P.

In the present embodiment, the base member 54 is the protector 54. The protector 54 includes a body 55 and the cover 56. A groove 55*d* is formed in the body 55. The wiring 50 is housed in the groove 55*d*. The cover 56 covers an opening of the groove 55*d*. The protector 54 is a molded component made of resin having relatively large rigidity, and does not have flexibility to be bended with the wiring 50. The protector 54 is molded to previously have a shape corresponding to the route of the wiring 50, and has rigidity large enough to maintain the shape. The wiring 50 is housed in the protector 54, thereby being kept in a state corresponding to the shape of the protector 54, that is a state along a predetermined route of the wiring 50.

The body 55 includes a bottom plate 55*a* and a plurality of side plates 55*b*. The plurality of side plates 55*b* protrude on a main surface of the bottom plate 55*a*. The body 55 has rigidity large enough so that the side plate 55*b* can keep a state of protruding from the bottom plate 55*a*. The plurality of side plates 55*b* are arranged at intervals in a width direction of the bottom plate 55*a*. The side plate 55*b* is provided to both ends of the bottom plate 55*a* along the width direction. The side plate 55*b* partitions an inner part and an outer part of the body 55. A protrusion dimension of the side plate 55*b* from the bottom plate 55*a* is smaller than a width dimension of the bottom plate 55*a*. Thus, in the body 55, a housing space housing the plurality of wirings 50 is flat. The side plate 55*b* is provided along a predetermined route, thus the flat housing space housing the plurality of wirings 50 is formed along a predetermined route in the protector 54. The plurality of wirings 50 are housed in the flat housing space, thus the wire harness 30 is kept in a flat form. The wire harness 30 needs not be flat. The protector may be formed to have substantially the same width dimension and height dimension.

In the present embodiment, the plate part is also provided to an intermediate part of the bottom plate 55*a* along the width direction. The plate part in the intermediate part of the bottom plate 55*a* along the width direction is a partition plate 55*c*. The partition plate 55*c* partitions an inner space of the body 55. The partition plate 55*c* is provided, thus the plurality of grooves 55*d* are provided in a parallel state in the inner space of the body 55. The side plate 55*b* or the partition plate 55*c* as a sidewall is located on both lateral sides of each groove 55*d*.

The partition plate 55*c* may be partially provided to an end portion on a side of the apparatus connector 42. In this case, combined are a configuration that the plurality of housing spaces in a parallel state are formed in a part where the partition plate 55*c* is provided and a configuration that one housing space in a part where the partition plate 55*c* is not provided is formed. It is also applicable that one of the configuration that the plurality of housing spaces in the parallel state are formed in the part where the partition plate 55*c* is provided and the configuration that one housing space in the part where the partition plate 55*c* is not provided is omitted and the other one thereof is continuously formed.

Herein, three partition plates 55*c* are provided in a parallel state in the end portion on the side of the apparatus connector 42. Accordingly, four grooves 55*d* are provided in a parallel state in the inner space of the body 55 in the end portion on the side of the apparatus connector 42. One wiring 50 is housed in each of three grooves 55*d* in four grooves 55*d*. The wiring 50 is a power source wire 50P or a ground wire. The plurality of wirings 50 are collectively housed in one groove 55*d* in four grooves 55*d*. The wiring 50 is the signal wire 50S.

The cover 56 includes a cover plate part 56*a* and a side plate part 56*b*. The cover plate part 56*a* covers the opening of the groove 55*d*. The side plate part 56*b* is overlapped with an outer side of the side plate 55*b*. The side plate part 56*b* may be omitted. The cover 56 is attached to the body 55. For example, it is applicable that a locking part provided to the cover 56 is locked to a receiving part provided to the body 55, thus the body 55 and the cover 56 are locked to each other.

The connectors 42 and 44 may be held by the protector 54. It is also applicable that the wiring 50 extends from an end portion of the protector 54 and the connectors 42 and 44 are provided away from the protector 54.

The protector 54 may include a fixing part for being fixed to an arrangement target. The fixing part may have a configuration that a fixing member such as a screw or a clip can be attached.

The magnetic core 70 is housed in the groove **55*d* together with the wiring 50, thus is positioned with respect to the protector 54 in a radial direction of the wiring 50**.

A positioning part positioning the magnetic core 70 in an extension direction of the wiring 50 may be provided to the protector 54. In the present embodiment, a positioning piece **55*e* protruding from a sidewall of the groove 55*d* to an inner part of the groove 55*d* is provided as the positioning part. The positioning piece 55*e* is provided to both sides of the magnetic core 70 along the extension direction of the wiring 50. If the magnetic core 70 is moved in the inner part of the protector 54 along the extension direction of the wiring 50, the magnetic core 70 is caught in the positioning piece 55*e*. Accordingly, the magnetic core 70 is positioned by the protector 54 along the extension direction of the wiring 50**.

Moreover, also applicable as the positioning part is a configuration that an interval of the sidewalls on both sides of the groove **55*d* in a part housing the wiring 50 is smaller than that of the sidewalls on both sides of the groove 55*d* in a part housing the magnetic core 70. In this case, if the magnetic core 70 is moved in the extension direction of the wiring 50, the magnetic core 70 is caught in the sidewall of the part housing the wiring 50 and is positioned. A concave part may be provided to the bottom plate 55*a* of the part housing the magnetic core 70 as the positioning part. The positioning part may be provided to the cover 56**.

It is also applicable that the interval between the bottom plate **55*a* of the body 55 and the cover 56 is equal to or smaller than a diameter of the magnetic core 70, and the magnetic core 70 is sandwiched between the bottom plate 55*a* of the body 55 and the cover 56, thus is positioned in the extension direction of the wiring 50**.

In the present embodiment, as illustrated in FIG. 5, a plurality of division bodies 71 are integrated to constitute the magnetic core 70. Herein, the pair of division bodies 71 divided in half are integrated to constitute the magnetic core 70. An arrangement surface where the power source wire 50P is disposed is provide to each of the pair of division bodies 71. The arrangement surface corresponds to half an inner peripheral surface of the through hole **70*h*. The pair of division bodies 71 are integrated so that end surfaces thereof along a circumferential direction abut each other. The pair of division bodies 71 are arranged in a direction in which the body 55 and the cover 56 are fitted to each other. For example, the power source wire 50P is disposed on the arrangement surface of the division body 71 while one of the pair of division bodies 71 are disposed on the bottom plate 55*a* of the groove 55*d*. Then, the other one of the pair of division bodies 71 is integrated with one of the pair of division bodies 71 to constitute the annular magnetic core 70. Subsequently, the cover 56 is attached to the body 55, thus the movement of the magnetic core 70 in the radial direction and the extension direction of the wiring 50 is regulated, and the magnetic core 70 is positioned by the protector 54**.

Herein, the locking part for maintaining the integrated state is not provided to the pair of division bodies 71. The locking part for maintaining the integrated state may be provided to the pair of division bodies 71. Herein, a housing body housing the division body 71 is not provided. A housing body housing the division body 71 may be provided. The locking part described above may be provided to the housing body.

The metal foil 72 covers the signal wire 50S housed in the groove **55*d*. The metal foil 72 includes a first metal foil part 73 and a second metal foil part 74. The first metal foil part 73 is provided between the body 55 and the signal wire 50S. The first metal foil part 73 extends along the bottom plate 55*a* and the sidewall inside the groove 55*d*, and is bended at a part where the bottom plate 55*a* and the sidewall are connected. The second metal foil part 74 is provided between the cover 56 and the signal wire 50S. The second metal foil part 74 extends along the cover 56 in an upper part of the groove 55*d***.

The metal foil 72 includes a sandwiched part 75 sandwiched between the body 55 and the cover 56. The sandwiched part 75 is sandwiched a tip end of the sidewall of the groove **55*d* on a side opposite to the bottom plate 55*a* and the cover 56. The sandwiched part 75 is provided, thus the metal foil 72 is positioned by the protector 54. The metal foil 72 may be positioned by the protector 54 with a configuration other than the sandwiched part 75. For example, the metal foil 72 may be attached to the protector 54** and positioned.

Figure 6:
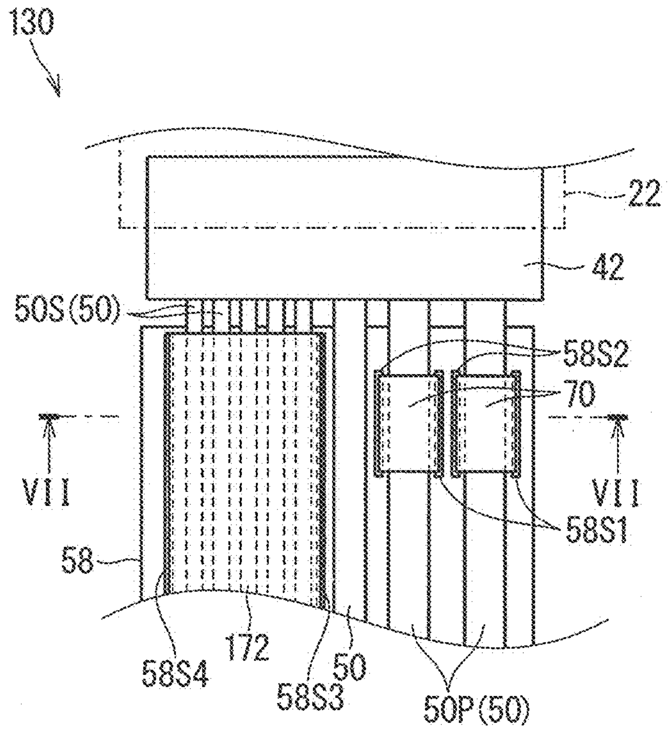
FIG. 6 is a plan view illustrating a wire harness according to a first modification example.
Figure 7:
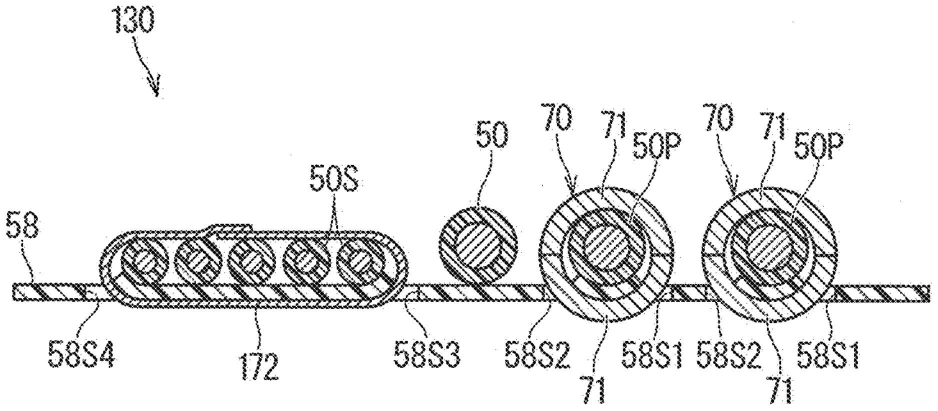
FIG. 7 is a cross-sectional view along a VII-VII line in FIG. 6.

The base member may be a member other than the protector 54. FIG. 6 and FIG. 7 illustrate a first modification example according to the base member. FIG. 6 is a plan view illustrating a wire harness 130 according to a first modification example. FIG. 7 is a cross-sectional view along a VII-VII line in FIG. 6.

In the wire harness 130 according to the first modification example, a base member 58 is a sheet member 58 having flexibility. The sheet member 58 has flexibility so as to be able to follow bending of the wiring 50. Accordingly, the base member 58 can be simply provided. The wiring 50 and the sheet member 58 can be bended together. The sheet member 58 covers the wiring 50 from one side.

The sheet member 58 is a resin sheet, for example. The sheet member 58 may be a sheet including a fiber material such as a non-woven cloth, for example. The sheet member 58 may be a sheet having a filled cross-sectional surface.

The wiring 50 may be fixed to the sheet member 58. A fixing state of the wiring 50 and the sheet member 58 is not particularly limited, but can be appropriately set. The wiring 50 and the sheet member 58 may be fixed by fusion, for example. In this case, resin included in at least one of the covering **53*b* of the electrical wire 53 as the wiring 50 and/or a main surface of the sheet member 58 is melted, and bonded and fixed to a surface of a counterpart member. The wiring 50 and the sheet member 58 may be attached by an adhesive material or a gluing material, for example. The plurality of wirings 50 are arranged side by side on the main surface of the sheet member 58. It is applicable that each wiring 50 is fixed to the sheet member 58**, thus a parallel state is maintained.

When the base member 58 is the sheet member 58, the magnetic core 70 and the sheet member 58 are positioned as follows. That is to say, slits 58S1 and 58S2 are formed on both sides of the power source wire 50P in the sheet member 58. The magnetic core 70 is passed through the slits 58S1 and 58S2. The magnetic core 70 covers a part between the slits 58S1 and 58S2 in the sheet member 58 together with the power source wire 50P. Accordingly, the magnetic core 70 and the sheet member 58 are positioned. For example, a banding member such as an adhesive tape or a banding band may be provided around the pair of division bodies 71. For example, the part between the slits 58S1 and 58S2 in the sheet member 58 may be sandwiched between an outer surface of the power source wire 50P and an inner surface of the magnetic core 70. For example, in the extension direction of the wiring 50, a dimension of the slits 58S1 and 58S2 may be equal to or slightly larger than that of the magnetic core 70, and an interval between the slits 58S1 and 58S2 may be equal to or slightly smaller than an inner diameter of the magnetic core 70.

When the base member 58 is the sheet member 58, the metal foil 172 and the sheet member 58 are positioned as follows. That is to say, slits 58S3 and 58S4 are formed on both sides of the signal wire 50S in the sheet member 58. The metal foil 172 is passed through the slits 58S3 and 58S4. Herein, the slits 58S3 and 58S4 are formed in an intermediate part of the sheet member 58 except for one end portion and the other end portion thereof along the extension direction of the signal wire 50S. The metal foil 172 covers a part between the slits 58S3 and 58S4 in the sheet member 58 together with the signal wire 50S.

In the example illustrated in FIG. 7, one metal foil 172 covers the whole surrounding of the signal wire 50S. The plurality of metal foils 72 may cover the whole surrounding of the signal wire 50S as with the wire harness 30 described above.

Figure 8:
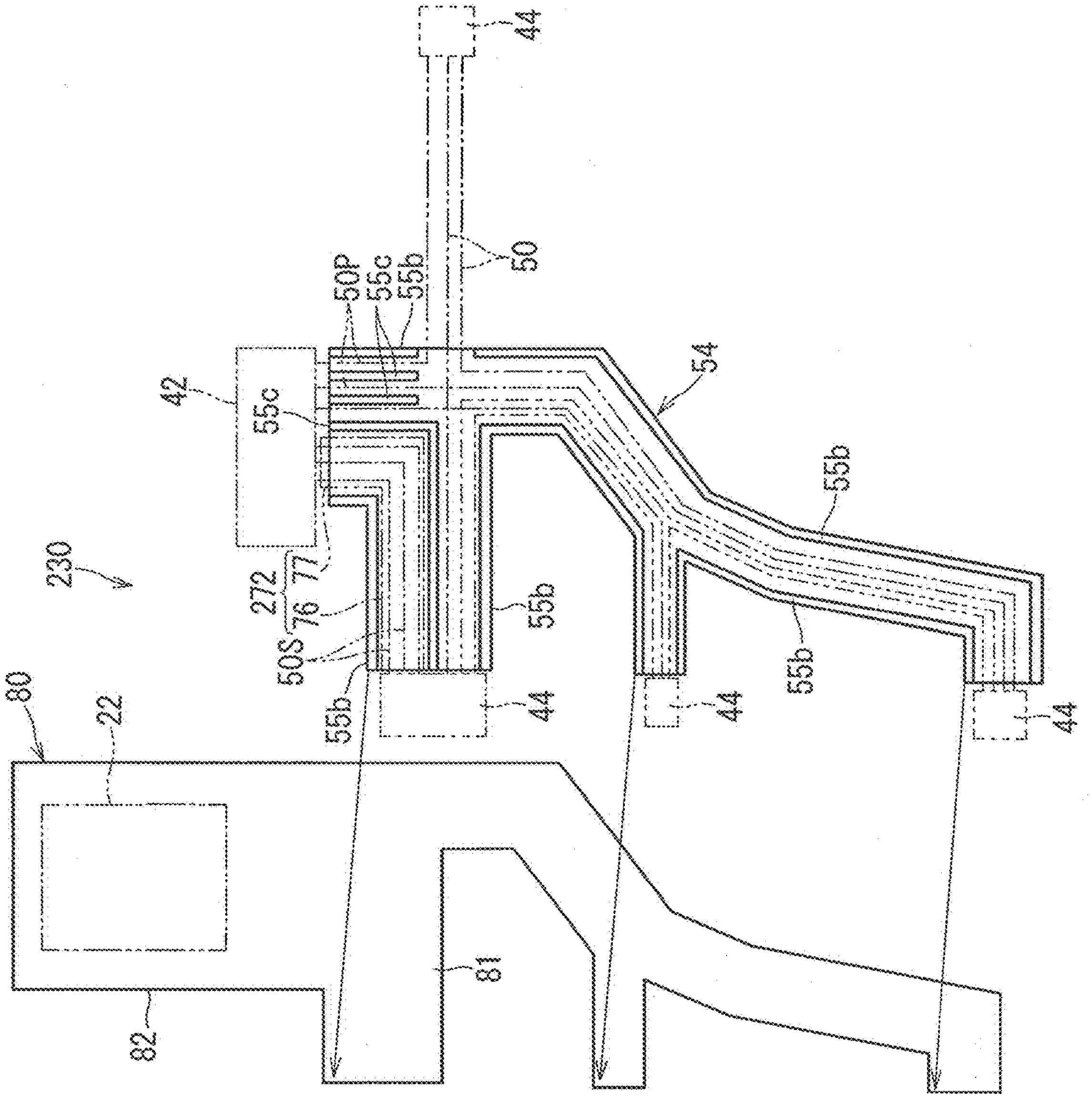
FIG. 8 is an exploded plan view illustrating a wire harness according to a second modification example.
Figure 9:
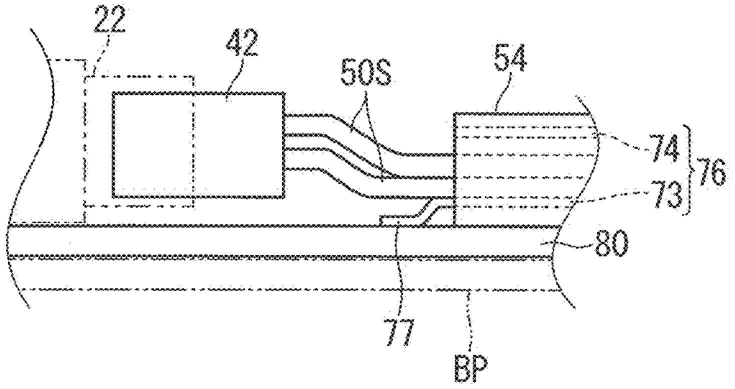
FIG. 9 is a side view illustrating the wire harness according to the second modification example.

FIG. 8 is an exploded plan view illustrating a wire harness 230 according to a second modification example. FIG. 9 is a side view illustrating the wire harness 230 according to the second modification example.

The wire harness 230 further includes a metal plate 80. The body 55 of the protector 54 intervenes between the wiring 50 and the metal plate 80. The metal plate 80 is a plate extending along the wiring 50. In other words, the plurality of wirings 50 include a portion extending along the metal plate 80. The metal plate 80 is disposed along a flat form on which the plurality of wirings 50 extend. The metal plate 80 is a plate-like member made of iron, aluminum, or copper, for example, as a material.

A metal foil 272 is electrically connected to the metal plate 80. The metal plate 80 may be electrically connected to a metal body panel BP of a vehicle. Generally, the metal body panel BP of the vehicle is used as a body ground. A metal foil 272 is electrically connected to the body ground via the metal plate 80.

The metal foil 72 of the wire harness 30 described above is disposed inside the protector 54. The metal foil 272 of the present wire harness 230 includes a foil body 76 located inside the protector 54 and an extension part 77 extending outside the protector 54 from the foil body 76. The extension part 77 extends outside the protector 54 from the end portion of the protector 54 together with the signal wire 50S. The extension part 77 has contact with the metal plate 80 through a gap between the connector 42 and the protector 54. Accordingly, the metal foil 272 and the metal plate 80 are electrically connected to each other.

The extension part 77 and the metal plate 80 may be bonded to each other. For example, a contact part between the extension part 77 and the metal plate 80 may be welded to each other. The foil body 76 includes the first metal foil part 73 and the second metal foil part 74 in the manner similar to the metal foil 72 described above. The extension part 77 extends from the first metal foil part 73. The extension part 77 may extend from the second metal foil part 74. The extension part 77 covers only a part of a surrounding of the signal wire 50S outside the protector 54. The extension part 77 may cover the whole surrounding of the signal wire 50S outside the protector 54.

The wire harness 130 described above in which the base member 58 is the sheet member 58 may also include the metal plate 80 in the manner similar to the wire harness 230, and the metal foil 172 may be connected to the metal plate 80. In the wire harness 130 described above, the metal foil 172 includes a part located on an outer surface (a surface on a side opposite to a side on which the signal wire 50S is disposed) of the sheet member 58, thus a part of the metal foil 72 located on the outer surface of the sheet member 58 can have contact with the metal plate 80 without the extension part 77.

The metal plate 80 may be used as a heat radiation plate for radiating heat of the electrical apparatus 22. The metal plate 80 may include a wiring arrangement region 81 in which the wiring 50 is disposed and an apparatus arrangement region 82 in which the electrical apparatus 22 is disposed. The apparatus arrangement region 82 and the electrical apparatus 22 may be thermally connected to each other. The apparatus arrangement region 82 and a metal part of the electrical apparatus 22 may be thermally connected to each other by a heat conductive rubber having insulation properties. The heat conductive rubber may be fixed to the electrical apparatus 22, the wire harness 230, or the metal plate 80. The heat conductive rubber is superior in heat conductive properties to air. The heat conductive rubber is preferably superior in heat conductive properties to resin forming the covering 53*b* of the wiring 50 and resin forming the base member. For example, the heat conductivity of the heat conductive rubber is equal to or larger than 1.0 (W/mK), and is preferably equal to or larger than 6.5 (W/mK). A conductor (a good conductor of electricity) may thermally connect the apparatus arrangement region 82 and an insulator part of the electrical apparatus 22 in place of the heat conductive rubber.

Example of Connection Relationship of Wiring

Figure 10:
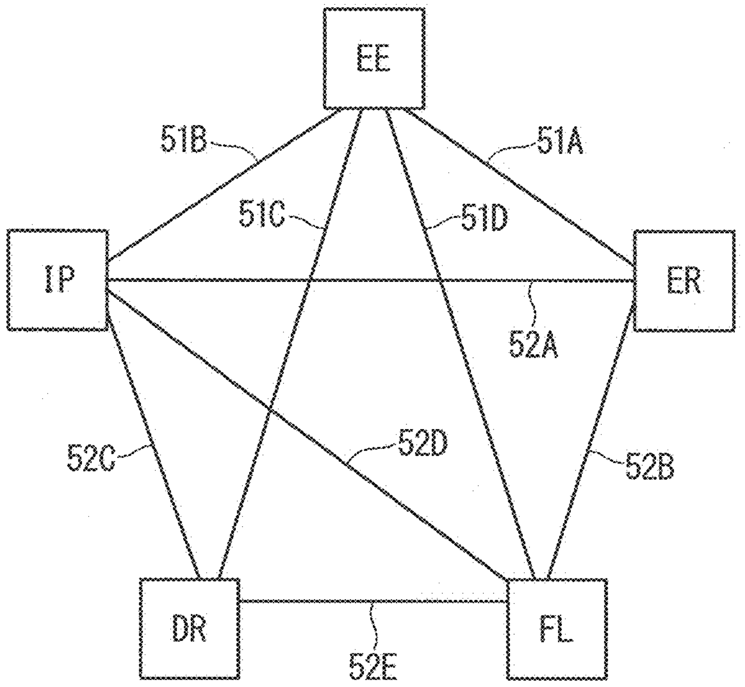
FIG. 10 is a diagram explaining a connection relationship between plural types of connectors and a plurality of wirings.
Figure 11:
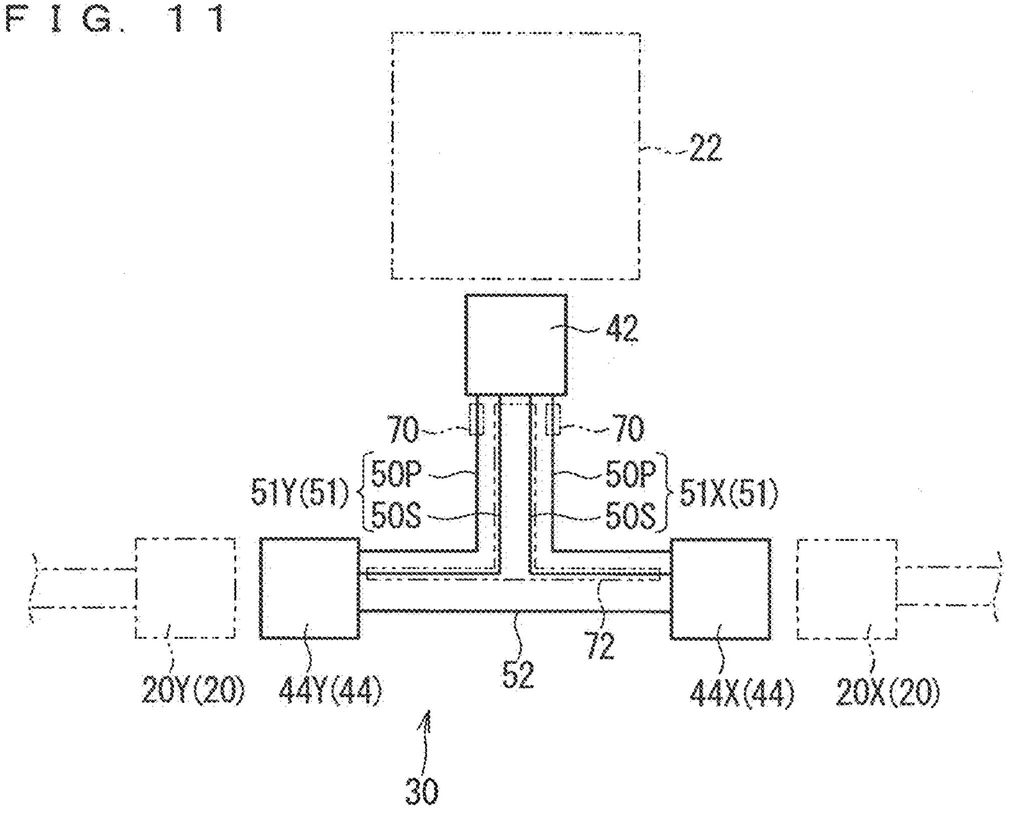
FIG. 11 is a diagram explaining a connection relationship between an apparatus connector, a first harness connector, and a second harness connector.

FIG. 10 is a diagram explaining a connection relationship between the plural types of connectors 42 and 44 and the plurality of wirings 50. FIG. 11 is a diagram explaining a connection relationship between the apparatus connector 42, a first harness connector 44X, and a second harness connector 44Y.

The wire harness 30 includes the apparatus connector 42 and the plural types of harness connectors 44. The apparatus connector 42 is connected to the electrical apparatus 22. Connectors of the counterpart wire harnesses 20 different from each other are connected to the plural types of harness connectors 40, respectively. Provided herein as the plural types of harness connectors 44 are an engine room (ER) harness connector 44A, an instrument panel (IP) harness connector 44B, a door (DR) harness connector 44C, and a floor (FL) harness connector 44D. All of the engine room harness connector 44A, the instrument panel harness connector 44B, the door harness connector 44C, and the floor harness connector 44D need not be provided as the plural types of harness connectors 44, however, it is sufficient that two or more types of harness connectors 44 are provided. When the roof harness 20E is assumed as the counterpart wire harness 20, a roof harness connector 44E is provided as one type of the plural types of harness connectors 44. The roof harness connector 44E may be provided on an upper side of the apparatus connector 42, the engine room harness connector 44A, the instrument panel harness connector 44B, the door harness connector 44C, and the floor harness connector 44D in the vehicle, for example. The wiring connected to the roof harness connector 44E may extend in the up-down direction on a lateral side of the electrical apparatus 22.

In the example illustrated in FIG. 3, each type of the connector 40 is one connector. That is to say, each of the apparatus connector 42, the engine room harness connector 44A, the instrument panel harness connector 44B, the door harness connector 44C, and the floor harness connector 44D is one connector. In the present disclosure, two or more connectors are considered one type of connector when the connection destination thereof is the same as each other. In other words, any number of connectors connected to the same electrical apparatus 22 or the same counterpart wire harness 20 are considered one type of connector. From the other viewpoint, each of the plural types of connectors 40 is made up of one or more connectors (referred to as a split connector hereinafter). Each type of connector may include a connector having the same structure. Herein, the connectors having the same structure are considered different types of connectors when the connection destinations thereof are different from each other.

At least one of the plural types of connectors 40 may include two or more split connectors. For example, the connector 40 having a largest number of electrodes (apparatus connector 42, for example) in the plural types of connectors 40 may include two or more split connectors. Accordingly, the connector 40 having the largest number of electrodes in the plural types of connectors 40 can be easily manufactured.

When the connector 40 includes the plurality of split connectors, it is preferable that the plural types of connectors 40 are four or more types of connectors, and the number of the split connectors is equal to or smaller than N. Herein, N is a number obtained by subtracting two from the number of types of the plural types of connectors 40 in the wire harness 30. Accordingly, the number of groups of connectors to be fitted can be reduced compared with a case where the other type of connector 40 is connected to the connection destination of one type of connector 40. Specifically, the connectors 40 in the wire harness 30 are five types connectors 40 of the apparatus connector 42, the engine room harness connector 44A, the instrument panel harness connector 44B, the door harness connector 44C, and the floor harness connector 44D. Thus, when each of the apparatus connector 42, the engine room harness connector 44A, the instrument panel harness connector 44B, the door harness connector 44C, and the floor harness connector 44D includes a plurality of split connectors, the number thereof is preferably three or less. For example, when each of four counterpart wire harnesses 20 of the engine room harness 20A, the instrument panel harness 20B, the door harness 20C, and the floor harness 20D is connected to the electrical apparatus 22, four groups of connectors need to be fitted. In contrast, when the apparatus connector 42 is made up of three or less split connectors, the number of groups of the connectors to be fitted can be three or less.

The apparatus wiring 51 in the plurality of wirings 50 connects the apparatus connector 42 and the harness connector 44. The through circuit wiring 52 in the plurality of wirings 50 connects the harness connectors 44.

As illustrated in FIG. 10, apparatus wirings 51A, 51B, 51C, and 51D are provided as the apparatus wiring 51 herein. The apparatus wiring 51A connects the engine room harness connector 44A and the apparatus connector 42. The apparatus wiring 51B connects the instrument panel harness connector 44B and the apparatus connector 42. The apparatus wiring 51C connects the door harness connector 44C and the apparatus connector 42. The apparatus wiring 51D connects the floor harness connector 44D and the apparatus connector 42. The number of each of the apparatus wirings 51A, 51B, 51C, and 51D may be one or more.

As illustrated in FIG. 10, through circuit wirings 52A, 52B, 52C, 52D, and 52E are provided herein as the through circuit wiring 52. The through circuit wiring 52A connects the engine room harness connector 44A and the instrument panel harness connector 44B. The through circuit wiring 52B connects the engine room harness connector 44A and the floor harness connector 44D. The through circuit wiring 52C connects the instrument panel harness connector 44B and the door harness connector 44C. The through circuit wiring 52D connects the instrument panel harness connector 44B and the floor harness connector 44D. The through circuit wiring 52E connects the door harness connector 44C and the floor harness connector 44D. The number of each of the through circuit wirings 52A, 52B, 52C, 52D, and 52E may be one or more.

Accordingly, the wiring 50 is provided to nine routes other than one route between the engine room harness connector 44A and the door harness connector 44C in ten routes of five types of connectors 42 and 44.

As illustrated in FIG. 11, in the present disclosure, the plural types of harness connectors 44 include the first harness connector 44X and the second harness connector 44Y. The first harness connector 44X is connected to a first counterpart wire harness 20X. The second harness connector 44Y is connected to a second counterpart wire harness 20Y. Three types of connectors 42 and 44 of the apparatus connector 42, the first harness connector 44X, and the second harness connector 44Y are connected to each other by the wiring 50. Specifically, the first harness connector 44X and the second harness connector 44Y are connected to the apparatus connector 42 by the plurality of apparatus wirings 51. A first apparatus wiring 51X connects the apparatus connector 42 and the first harness connector 44X. A second apparatus wiring 51Y connects the apparatus connector 42 and the second harness connector 44Y. The through circuit wiring 52 connects the first harness connector 44X and the second harness connector 44Y. Described is whether four types of harness connectors 44 of the engine room harness connector 44A, the instrument panel harness connector 44B, the door harness connector 44C, and the floor harness connector 44D fall under the first harness connector 44X and the second harness connector 44Y.

Six groups of connectors are generated as a combination made by selecting two of four types of harness connectors 44 of the engine room harness connector 44A, the instrument panel harness connector 44B, the door harness connector 44C, and the floor harness connector 44D. Each of five of six groups except for one group made up of the engine room harness connector 44A and the door harness connector 44C includes the through circuit wiring 52 connecting two types of harness connectors 44 in each of five groups. All of four types of harness connectors 44 of the engine room harness connector 44A, the instrument panel harness connector 44B, the door harness connector 44C, and the floor harness connector 44D are connected to the apparatus connector 42 via the apparatus wiring 51. Thus, five of six groups except for one group made up of the engine room harness connector 44A and the door harness connector 44C can be considered a combination of the first harness connector 44X and the second harness connector 44Y.

In the meanwhile, the wire harness 30 does not include the through circuit wiring 52 connecting the engine room harness connector 44A and the door harness connector 44C. Thus, the engine room harness connector 44A and the door harness connector 44C are not considered a combination of the first harness connector 44X and the second harness connector 44Y.

It is applicable that three or more types of harness connectors 44 are provided as the plural types of harness connectors 44, and the wire harness 30 includes the through circuit wiring 52 connecting three or more types of harness connectors 44. Four groups of connectors are generated as a combination made by selecting three of four types of harness connectors 44 of the engine room harness connector 44A, the instrument panel harness connector 44B, the door harness connector 44C, and the floor harness connector 44D. Each of two of four groups except for two groups including the engine room harness connector 44A and the door harness connector 44C together includes the through circuit wiring 52 connecting three types of harness connectors 44 in each of four groups. Each of two of four groups except for two groups including the engine room harness connector 44A and the door harness connector 44C together can be considered the three or more types of harness connectors 44.

Specifically, the engine room harness connector 44A, the instrument panel harness connector 44B, and the floor harness connector 44D are connected to each other via the through circuit wirings 52A, 52B, and 52D. Thus, a combination of the engine room harness connector 44A, the instrument panel harness connector 44B, and the floor harness connector 44D can be considered the three or more types of harness connector 44. In the similar manner, the instrument panel harness connector 44B, the door harness connector 44C, and the floor harness connector 44D are connected to each other via the through circuit wirings 52C, 52D, and 52E. Thus, a combination of the instrument panel harness connector 44B, the door harness connector 44C, and the floor harness connector 44D can be considered the three or more types of harness connectors 44.

However, the through circuit wiring 52 connecting the engine room harness connector 44A and the door harness connector 44C may be provided in the wire harness 30. In this case, the engine room harness connector 44A, the instrument panel harness connector 44B, the door harness connector 44C, and the floor harness connector 44D are connected to each other via the through circuit wiring 52.

The wiring 50 described above is also considered to include the plurality of wirings 51X and 51Y branched from the apparatus connector 42 to be connected to the first harness connector 44X and the second harness connector 44Y.

The first apparatus wiring 51X and second apparatus wiring 51Y include the power source wire 50P and the signal wire 50S, respectively. The magnetic core 70 is provided to each power source wire 50P, and the metal foil 72 is provided to each signal wire 50S.

An arrangement example of the wire harness 30 in the vehicle 10 is described based on a premise of the example of the connection relationship of the wiring 50 described above.

As illustrated n FIG. 2, a part of the wire harness 30 is disposed along the dashboard panel 11. A wiring part extending from the engine room harness connector 44A is held to be disposed along the dashboard panel 11.

The other part of the wire harness 30 is disposed along the cowl side panel 15. The instrument panel harness connector 44B, the door harness connector 44C, and the floor harness connector 44D are held so that they are arranged in a height direction and a wiring part extending from each of the instrument panel harness connector 44B, the door harness connector 44C, and the floor harness connector 44D are disposed along the cowl side panel 15.

The wire harness 30 is disposed in a bended state in a thickness direction between a portion disposed along the dashboard panel 11 and a portion disposed along the cowl side panel 15. For example, the protector 54 may be provided to a part of the wire harness 30 disposed along the cowl side panel 15. The wiring 50 may be bended outside the protector 54. The sheet member 58 may be provided to a part of the wire harness 30 disposed along the cowl side panel 15 and a part thereof disposed along the dashboard panel 11. The sheet member 58 may be bended together with the wiring 50 between a part thereof disposed along the cowl side panel 15 and a part thereof disposed along the dashboard panel 11.

A length of each of the plurality of wirings 50 is equal to or smaller than one meter. In the wire harness 30, the longest wiring 50 is the through circuit wiring 52B connecting the engine room harness connector 44A and the floor harness connector 44D or the through circuit wiring 52C connecting the instrument panel harness connector 44B and the floor harness connector 44D. A length of each of these through circuit wirings 52B and 52C is equal to or smaller than one meter.

Configuration Example for Keeping Wiring in Flat State

Figure 12:
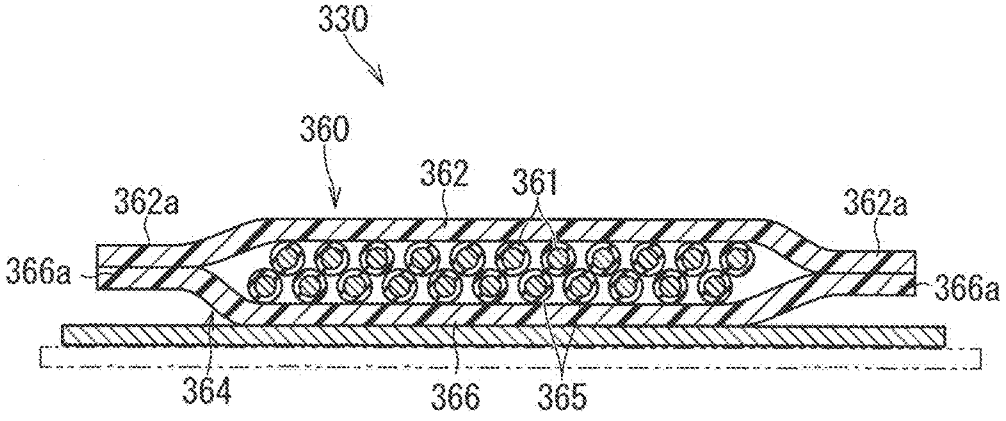
FIG. 12 is a cross-sectional view illustrating a wiring and a base member according to a third modification example.

FIG. 12 illustrates a third modification example of the wiring 50 and the base member 54. As illustrated in FIG. 12, a plurality of wiring groups 360 and 364 may be stacked to constitute a wire harness 330. In the example illustrated in FIG. 12, some of the plurality of wirings 50 are collected to constitute a first wiring group 360, and the other some of the plurality of wirings 50 are collected separately from the first wiring group 360 to constitute a second wiring group 364. Herein, the plurality of wirings 50 are fixed to the base members 362 and 366 and collected.

Each of the first wiring group 360 and the second wiring group 364 are flatly formed and stacked to each other. Herein, the first wiring group 360 includes a plurality of electrical wires 361 and the flat base member 362 keeping the plurality of electrical wires 361 in a flat state. The electrical wire 361 and the base member 362 are fixed to each other herein. The electrical wire 361 and the base member 362 may not be fixed to each other. The second wiring group 364 includes a plurality of electrical wires 365 and the flat base member 366 keeping the plurality of electrical wires 365 in a flat state. The electrical wire 365 and the base member 366 are fixed to each other herein. The electrical wire 365 and the base member 366 may not be fixed to each other.

The first wiring group 360 and the second wiring group 364 are stacked so that a main surface of the base member 362 to which the electrical wire 361 is fixed and a main surface of the base member 366 to which the electrical wire 365 is fixed face each other. Accordingly, the electrical wires 361 and 365 are surrounded and protected by the base members 362 and 366. However, it is also applicable that the first wiring group 360 and the second wiring group 364 are stacked so that the main surface of the base member 362 to which the electrical wire 361 is fixed and the main surface of the base member 366 to which the electrical wire 365 is not fixed face each other, or are stacked so that the main surface of the base member 366 to which the electrical wire 365 is fixed and the main surface of the base member 362 to which the electrical wire 361 is not fixed face each other. It is also applicable that the first wiring group 360 and the second wiring group 364 are stacked so that the main surface of the base member 362 to which the electrical wire 361 is not fixed and the main surface of the base member 366 to which the electrical wire 365 is not fixed face each other.

The first wiring group 360 and the second wiring group 364 are stacked so that the electrical wire 361 and the electrical wire 365 are overlapped with each other. The electrical wires 361 and 365 have two stages made up of the electrical wire 361 in one stage and the electrical wire 365 in one stage overlapped with each other. There may be a case where a width dimension is desired to be reduced in at least a part of the wire harness 30 even when a thickness dimension increases to some extent depending on a space where the wire harness 30 is disposed. In such a case, the electrical wires 361 and 365 may be stacked in three or more stages, for example. It is also applicable that the base members 362 and 366 are not provided but the electrical wires 361 and 365 are bundled to have a circular shape in cross section by a banding member such as a tape, for example.

The base member 362 includes an extension piece 362*a*. The extension piece 362*a* is provided on both sides of a portion where the electrical wire 361 is disposed. The base member 366 also includes an extension piece 366*a* similar to the extension piece 362*a*. When the extension piece 362*a* of the base member 362 and the extension piece 366*a* of the base member 366 are fixed to each other, the first wiring group 360 and the second wiring group 364 are fixed to each other. However, the extension piece 362*a* of the base member 362 and the extension piece 366*a* of the base member 366 need not be fixed to each other.

Example of Dividing Plurality of Wirings

Figure 13:
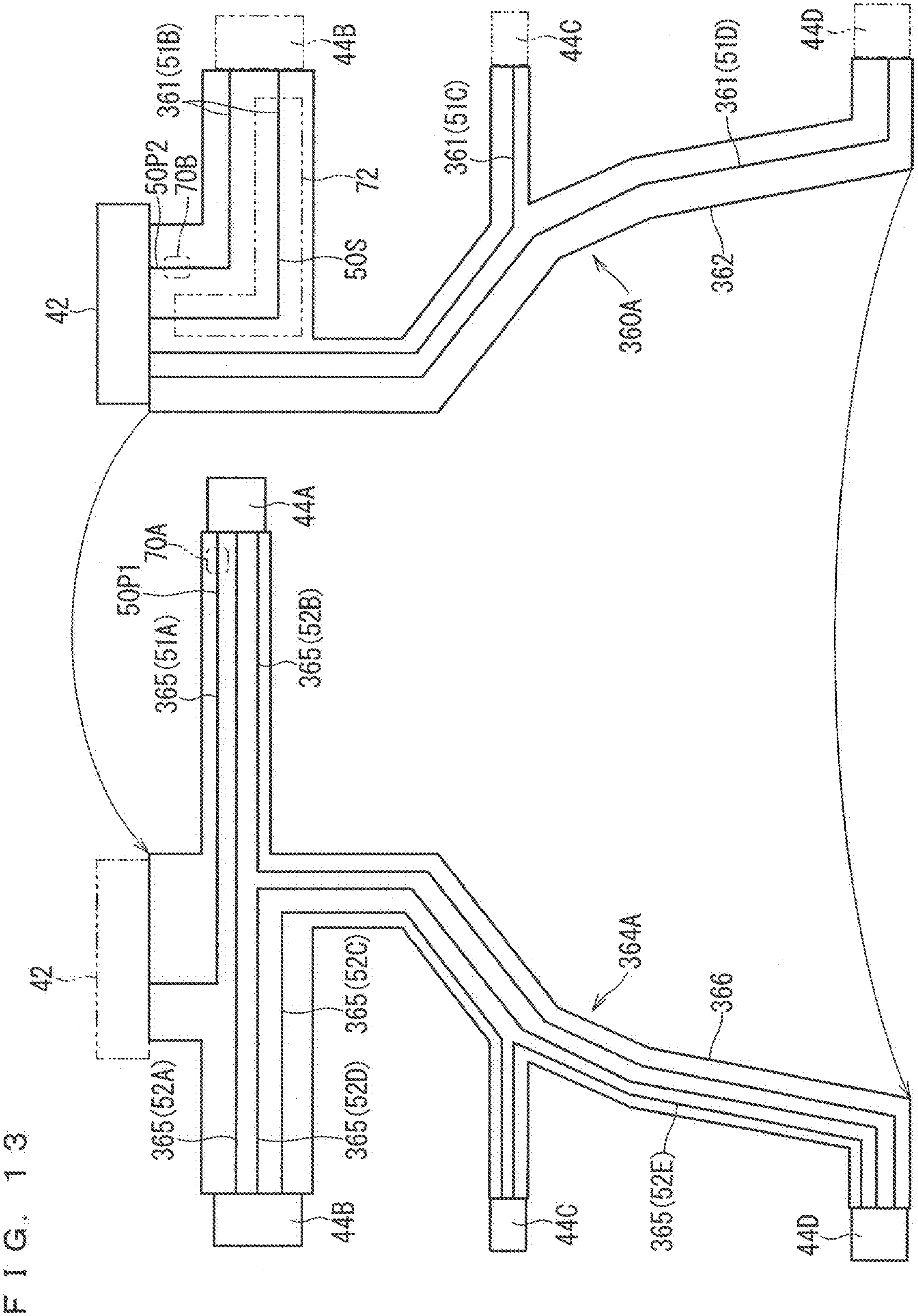
FIG. 13 is a diagram illustrating an example of a way of dividing the plurality of wirings.
Figure 14:
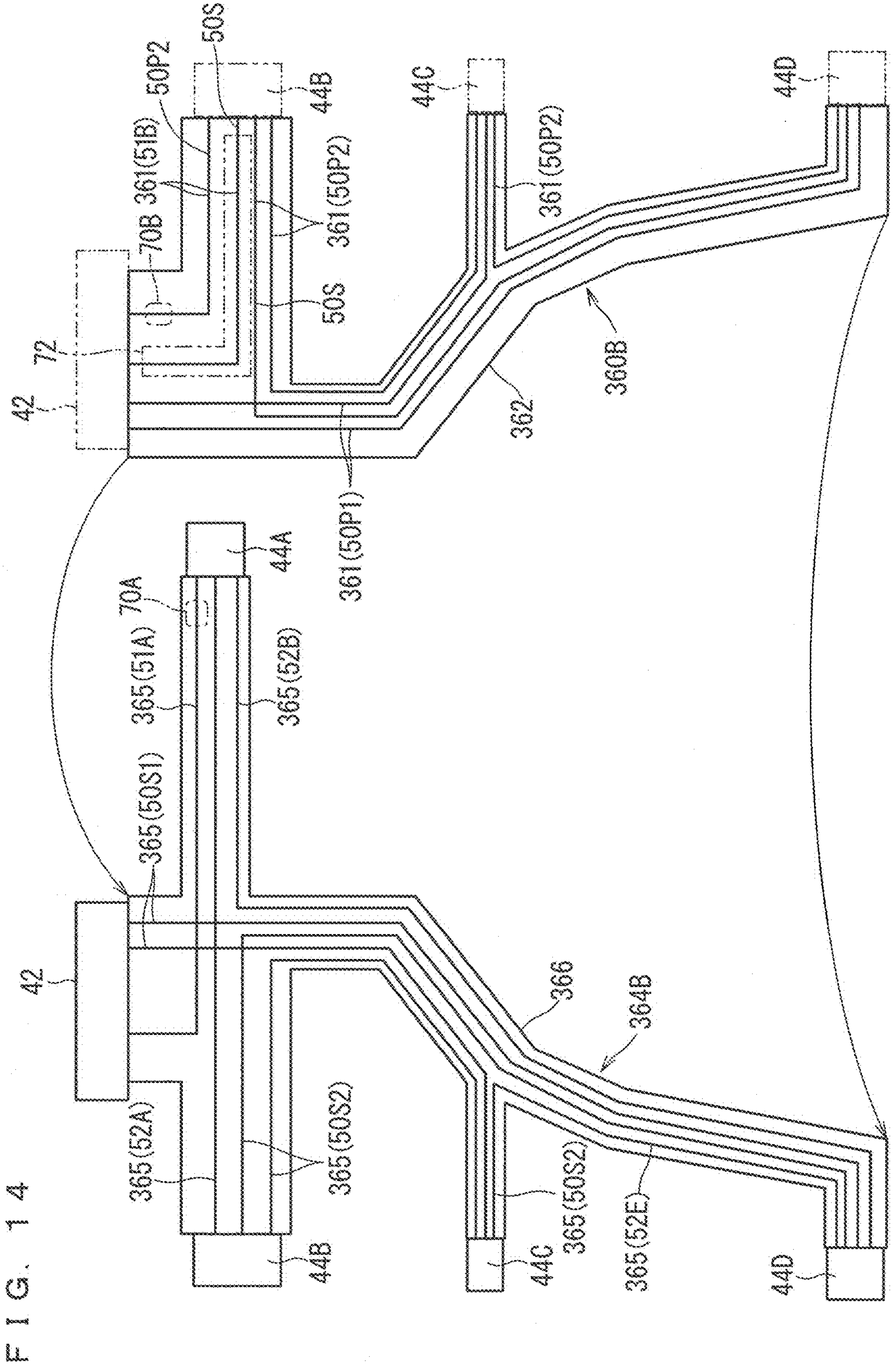
FIG. 14 is a diagram illustrating another example of a way of dividing the plurality of wirings.

As the example illustrated in FIG. 12, when the first wiring group 360 and the second wiring group 364 are stacked to constitute the wire harness 330, a way of sorting the plurality of wirings 50 into the first wiring group 360 and the second wiring group 364 is not particularly limited, but can be appropriately set. The example of dividing the plurality of wirings 50 is described with reference to FIG. 13 and FIG. 14. FIG. 13 is a diagram illustrating an example of a way of dividing the plurality of wirings 50. FIG. 14 is a diagram illustrating another example of a way of dividing the plurality of wirings 50.

In the example illustrated in FIG. 13, the plurality of wirings 50 are sorted based on the apparatus wiring 51 and the through circuit wiring 52 described above. Specifically, more than half of the first wiring group 360A are the apparatus wirings 51. More than half of the second wiring group 364A are the through circuit wirings 52. 60% or more, 70% or more, 80% or more, or 90% or more of the first wiring group 360A may be the apparatus wirings 51. All (100%) of the first wiring group 360A may be the apparatus wirings 51. In the similar manner, 60% or more, 70% or more, 80% or more, or 90% or more of the second wiring group 364A may be the through circuit wirings 52. All (100%) of the second wiring group 364 may be the through circuit wirings 52.

In the example illustrated in FIG. 13, all (100%) of the first wiring group 360A are the apparatus wirings 51. 90% or more of the second wiring group 364A are the through circuit wirings 52. Provided to the second wiring group 364A is the apparatus wiring 51A connecting the engine room harness connector 44A and the apparatus connector 42 in the apparatus wirings 51. The apparatus wirings 51B, 51C, and 51D except for the apparatus wiring 51A in the apparatus wirings 51 are provided to the first wiring group 360A. All of the through circuit wirings 52 are provided to the second wiring group 364A.

In the first wiring group 360A, the electrical wires 361 are disposed so as not to intersect with each other on the base member 362. Also in the second wiring group 364A, the electrical wires 365 are disposed so as not to intersect with each other on the base member 366. Accordingly, increase of the thickness of each of the first wiring group 360 and the second wiring group 364 is suppressed, and increase of the thickness of the wire harness 30 in which the first wiring group 360 and the second wiring group 364 are stacked to each other is suppressed. However, in at least one of the first wiring group 360 and/or the second wiring group 364, an intersection part where the electrical wires intersect with each other on the base member may also be provided.

In the example illustrated in FIG. 14, the wirings 50 are sorted into the first wiring group 360B and the second wiring group 364B based on whether the wiring 50 is the power source wire 50P or the signal wire 50S. Specifically, more than half of the first wiring group 360B are the power source wire 50P, and more than half of the second wiring group 364B are the signal wire 50S. A ratio of the power source wires 50P in the first wiring group 360B is higher than that of the power source wires in the second wiring group 364B. Accordingly, most of the power source wires 50P and most of the signal wires 50S can be separated.

The ratio of the power source wires 50P in the first wiring group 360B is not particularly limited, but can be appropriately set. For example, the ratio of the power source wire 50P in the first wiring group 360B may be equal to or larger than 50% or smaller than 50%. That is to say, more than half of the first wiring group 360B may be the power source wires 50P or signal wires.

More than half of all the power source wires in the wire harness 330 may be disposed in the first wiring group 360B. More than half of all the signal wires in the wire harness 330 may be disposed in the second wiring group 364B. The first wiring group 360B may or may not include the signal wire. The second wiring group 364B may or may not include the power source wire.

In the example illustrated in FIG. 14, the power source wire 50P in the wirings 50 connected to the door harness connector 44C and the wirings 50 connected to the floor harness connector 44D is provided in the first wiring group 360B, and the signal wire 50S is provided in the second wiring group 364. A power source wire 50P1 in the first wiring group 360B connects each of the door harness connector 44C and the floor harness connector 44D to the apparatus connector 42. A power source wire 50P2 in the first wiring group 360B connects each of the door harness connector 44C and the floor harness connector 44D to the other harness connector 44. A signal wire 50S1 in the second wiring group 364B connects each of the door harness connector 44C and the floor harness connector 44D to the apparatus connector 42. A signal wire 50S2 in the second wiring group 364B connects each of the door harness connector 44C and the floor harness connector 44D to the other harness connector 44.

In the wire harness 330, a portion disposed along the dashboard panel 11 is only the second wiring group 364 in the first wiring group 360 and the second wiring group 364. Thus, the wire harness 330 is easily bended in the thickness direction between the portion disposed along the dashboard panel 11 and the portion disposed along the cowl side panel 15.

In the example illustrated in FIG. 13 and FIG. 14, a magnetic core 70A is provided to the power source wire 50P1 of the apparatus wiring 51A. A magnetic core 70B is provided to the power source wire 50P2 of the apparatus wiring 51B. The metal foil 72 is provided to an intermediate part of the apparatus wiring 51B except for one end portion and the other end portion of the signal wire 50S. The metal foil 72 is provided along the bending route of the signal wire 50S.

The power source wire 50P1 described above is an example of a first power source wire supplying electrical power from the power source to the electrical apparatus 22, and the magnetic core 70A is an example of a first magnetic core covering the first power source wire. Herein, a first harness connector to which the first power source wire is connected is the engine room harness connector 44A. The power source wire 50P2 described above is an example of a second power source wire supplying electrical power from the electrical apparatus 22 to the load, and a magnetic core 70B is an example of a second magnetic core covering the second power source wire. Herein, a second harness connector to which the second power source wire is connected is a connector belonging to a group made up of the instrument panel harness connector 44B, the door harness connector 44C, the floor harness connector 44D, and the roof harness connector 44E.

The magnetic core 70 may be provided to a side closer to a positive electrode in a circuit from the positive electrode toward a negative electrode of the electrode. The magnetic core 70A is provided to an end portion closer to the engine room harness connector 44A in the power source wire 50P1. The magnetic core 70B is provided to an end portion closer to the apparatus connector 42 in the power source wire 50P2.

Effect etc.

According to the wire harness 30 having the above configuration, countermeasures against noise can be performed on the target wiring by the magnetic core 70 positioned on the base member 54 keeping the plurality of wirings 50 including the target wiring in the flat state. Accordingly, countermeasures against noise can be simply performed on the wire harness 30.

In the present embodiment, the noise countermeasure components 70 and 72 are provided to the apparatus wiring 51 connected to the electrical apparatus 22. Accordingly, countermeasures against noise can be performed on the electrical apparatus 22 by the wire harness 30. Accordingly, a noise countermeasure component of the electrical apparatus 22 can be omitted or simplified, and the electrical apparatus 22 can be downsized. Even in a case where the countermeasures against the noise on the electrical apparatus 22 is necessary when a system is evaluated after the electrical apparatus 22 is designed, the countermeasures against the noise can be performed on a side of the wire harness 30 without changing a design of the electrical apparatus 22.

Particularly, a configuration of locating a zone electrical control unit (ECU) for each zone in the vehicle recently increases separately from a central ECU. It is desired that the countermeasure against the noise is considered and downsizing is achieved in at least one of the central ECU and/or the zone ECU. According to the present embodiment, when the electrical apparatus 22 is the zone ECU, the countermeasures against the noise for the zone ECU can be performed on the side of the wire harness 30, thus the zone ECU can be downsized.

The target wiring to which the magnetic core 70 is attached includes the power source wire 50P in the plurality of apparatus wirings 51. Accordingly, the countermeasures against the noise can be simply performed on the power source wire 50P connected to the electrical apparatus 22.

The magnetic core 70 includes the first magnetic core 70A covering the first power source wire 50P1. Accordingly, the countermeasures against the noise can be simply performed on the first power source wire 50P1 supplying the electrical power from the power source to the electrical apparatus 22.

The magnetic core 70 includes the second magnetic core 70B covering the second power source wire 50P2. Accordingly, the countermeasures against the noise can be simply performed on the second power source wire 50P2 supplying the electrical power from the electrical apparatus 22 to the load.

When the magnetic core 70 is housed in the groove 55*d* of the protector 54 as with the wire harness 30, the magnetic core 70 can be simply positioned on the protector 54 as the base member 54.

When the magnetic core 70 covers the part of the sheet member 58 between the slits 58S1 and 58S2 together with the power source wire 50P as with the wire harness 130, the magnetic core 70 can be simply positioned on the sheet member 58 as the base member 58.

Figure 15:
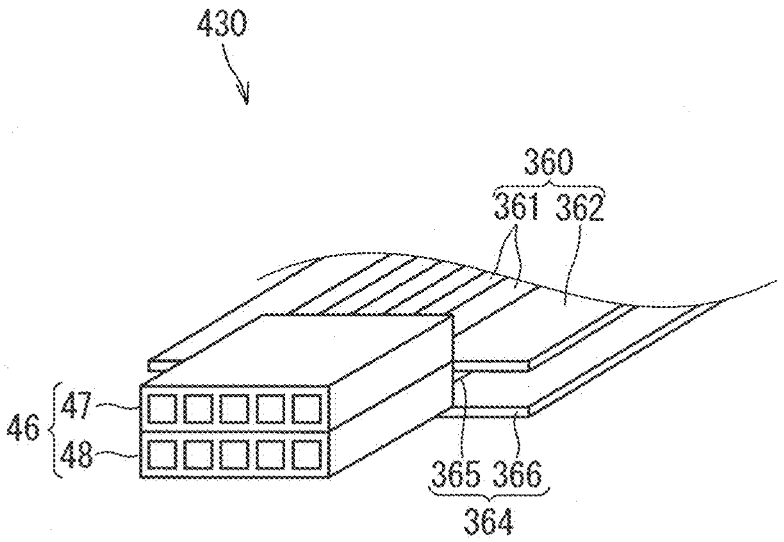
FIG. 15 is a perspective view illustrating a wire harness according to a fourth modification example.
Figure 16:
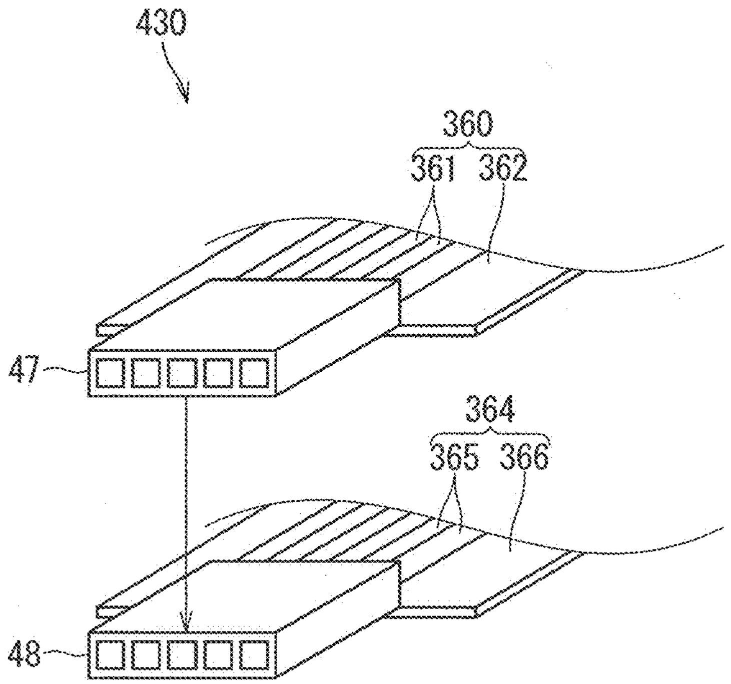
FIG. 16 is an exploded perspective view illustrating the wire harness according to the fourth modification example.

FIG. 15 is a perspective view illustrating a wire harness 430 according to a fourth modification example. FIG. 16 is an exploded perspective view illustrating the wire harness 430 according to the fourth modification example.

A shape of a connector 46 in the wire harness 430 according to the fourth modification example is different from the shape of the connector 44 in the wire harness 30 described above. Specifically, at least one type of connector 44 in the plural types of connectors 44 is made up of a plurality of split connectors 47 and 48. The plurality of split connectors 47 and 48 include a first split connector 47 and a second split connector 48. The wiring 50 of the first wiring group 360 is connected to the first split connector 47. The wiring of the second wiring group 364 is connected to the second split connector 48. Accordingly, an operation of inserting one of the wiring 50 of the first wiring group 360 and the wiring 50 of the second wiring group 364 into the connector 44 into which the other one of wiring 50 of the first wiring group 360 and the wiring 50 of the second wiring group 364 is previously inserted hardly occurs compared with the case of the wire harness 30. Accordingly, it is easy to separately manufacture the first wiring group 360 and the second wiring group 364 and subsequently integrate them to constitute the wire harness 430.

Herein, the first split connector 47 and the second split connector 48 are integrated to constitute a stacked connector 46. Accordingly, at least one type of connector 46 in the plural types of connectors 40 is the stacked connector 46 made up of the plurality of split connectors 47 and 48 integrated with each other. Each type of connector 44 may be divided in a form other than the stacked connector 46. For example, the apparatus connector 42 may be divided into a plurality of split connectors arranged in a direction intersecting with the thickness direction. It is also applicable that two split connectors are not integrated but are separately connected to the electrical apparatus 22.

Figure 17:
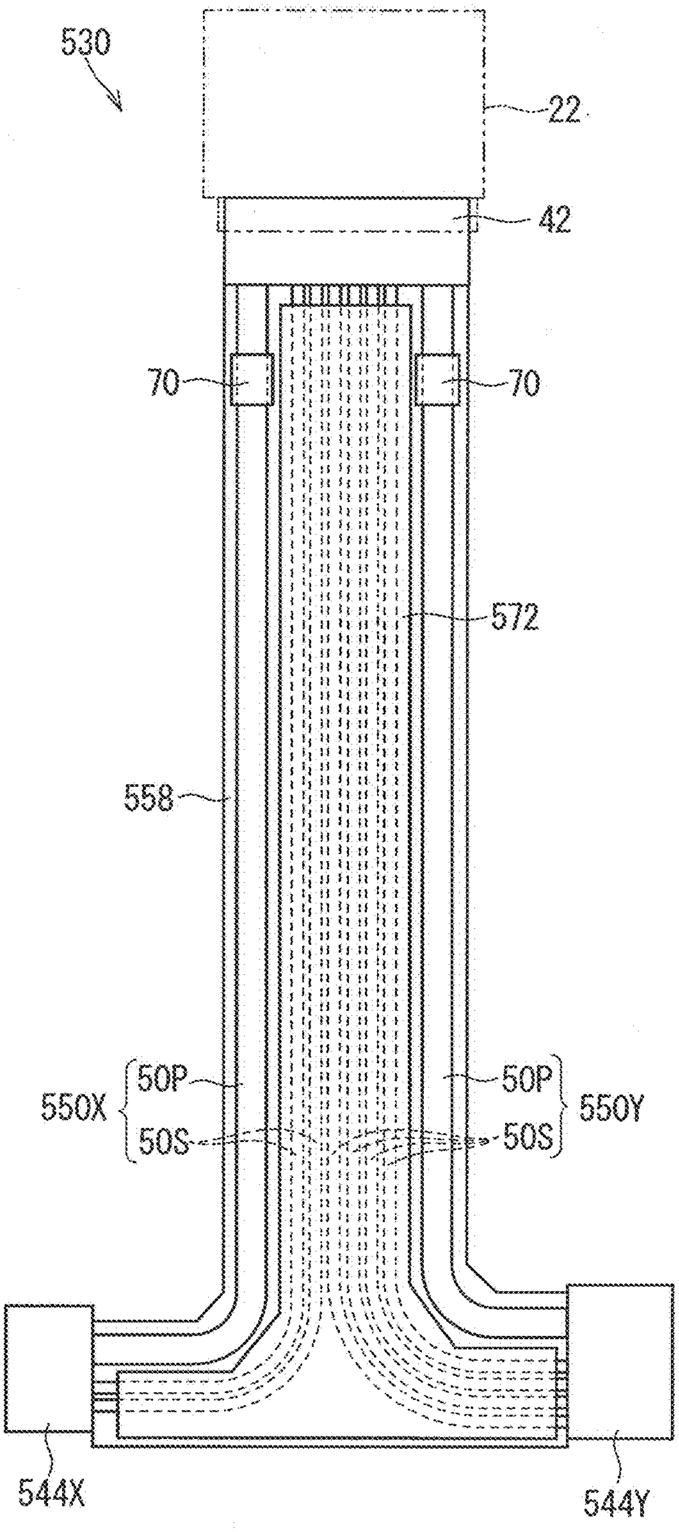
FIG. 17 is a plan view illustrating a wire harness according to a fifth modification example.

FIG. 17 is a plan view illustrating a wire harness 530 according to a fifth modification example.

In the wire harness 530, a wiring 550 corresponding to the wiring 50 includes a plurality of wirings 550X and 550Y divided into a plurality of (herein, two) harness connectors 544X and 544Y from the apparatus connector 42. The wiring 550 is fixed to a base member 558 such as a sheet member, and is kept in a flat state. A metal foil 572 covers a branch part of the plurality of wirings 550X and 550Y.

Figure 18:
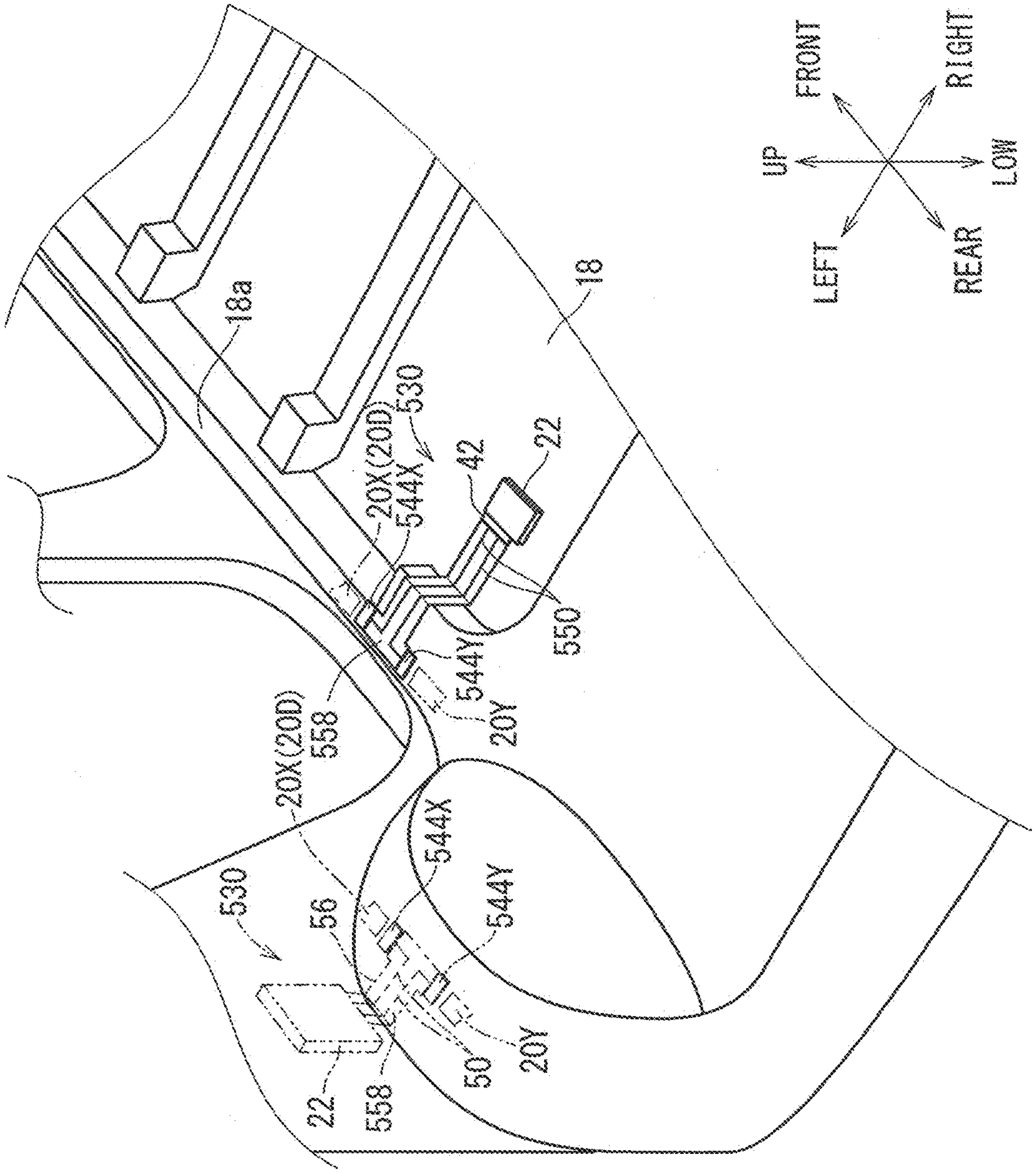
FIG. 18 is a perspective view illustrating a state where the wire harness according to the fifth modification example is disposed in a vehicle.

FIG. 18 is a schematic perspective view illustrating an arrangement area of the wire harness 530 according to the fifth modification example. The arrangement area of the wire harness 530 may be an area close to a rear seat or a rear luggage, for example. In this case, a floor harness, a sheet harness, or a rear harness, for example, are assumed as the counterpart wire harness 20. When the wire harness 530 is bended and disposed, and includes the metal plate 80 described above, also applicable is a configuration that metal plate 80 described above is divided into a part located one side of the bended part and a part located on the other side thereof. Accordingly, the wire harness 530 can be easily bended at the bended part after the metal plate 80 is attached.

At least some of the plural types of connectors may be a standby connector fixed to a vehicle, for example. For example, at least some of the plural types of harness connectors 44 may be a standby connector. Accordingly, the counterpart wire harness can be easily connected to the harness connector 44.

The noise countermeasure components 70 and 72 are not provided to the through circuit wiring 52, but may also be provided to the through circuit wiring 52.

In the above description, both the magnetic core 70 and the metal foil 72 are provided as the noise countermeasure components, however, this configuration is not necessary. The metal foil 72 may not be provided as the noise countermeasure component.

The configurations described in the embodiments and modification examples thereof can be appropriately combined as long as they are not contradictory.

EXPLANATION OF REFERENCE SIGNS

10 vehicle
11 dashboard panel
12 body part
13 protrusion part
14, 16 through hole
15 cowl side panel
17 instrument panel reinforcement
18 floor panel
18*a* rocker part
19 A pillar
20 counterpart wire harness (20A engine room harness, 20B instrument panel harness, 20C door harness, 20D floor harness, 20E roof harness)
20X first counterpart wire harness
20Y second counterpart wire harness
22 electrical apparatus
30, 130, 230, 330, 530 wire harness
42 apparatus connector
44 harness connector (44A engine room harness connector, 44B instrument panel harness connector, 44C door harness connector, 44D harness connector, 44E roof harness connector)
44X, 544X first harness connector
44Y, 544Y second harness connector
46 stacked connector
47 first split connector
48 second split connector
50, 550, 550X, 550Y wiring
50P power source wire
50P1 first power source wire
50P2 second power source wire
50S signal wire
51, 51A, 51B, 51C, 51D apparatus wiring
51X first apparatus wiring
51Y second apparatus wiring
52, 52A, 52B, 52C, 52D, 52E through circuit wiring
53, 361, 365 electrical wire
53*a* core wire
53*b* covering
54 protector (base member)
55 body
55*a* bottom plate
55*b* side plate
55*c* partition plate
55*d* groove
55*e* positioning piece
56 cover
56*a* cover plate part
56*b* side plate part
58, 362, 366, 558 sheet member (base member)
58S1, 58S2, 58S3, 58S4 slit
70 magnetic core
70A first magnetic core
70B second magnetic core
70*h* through hole
71 division body
72, 172, 272 metal foil
73 first metal foil part
74 second metal foil part
75 sandwiched part
76 foil body
77 extension part
80 metal plate
81 wiring arrangement region
82 apparatus arrangement region
360, 360A, 360B first wiring group
362*a*, 366*a* extension piece
364, 364A, 364B second wiring group

The invention claimed is:

1. A wire harness, comprising:
a plurality of wirings;
a base member keeping the plurality of wirings in a flat state; and
a magnetic core positioned on the base member and covering a target wiring in the plurality of wirings, wherein
the base member is a protector including a body in which a groove housing the target wiring is formed and a cover covering the target wiring from a side opposite to the body,
the magnetic core is housed in the groove,
the target wiring includes a power source wire, and
the magnetic core covering the power source wire includes a pair of division bodies integrated together and arranged in a direction in which the body and the cover are fitted to each other.

2. The wire harness according to claim 1, wherein
the plurality of wirings include a signal wire,
the body of the protector further includes an other groove,
the signal wire housed in the other groove is covered by a metal foil, the metal foil including first and second metal foil parts respectively covering inner surfaces of the other groove and a lower surface of the cover, and a sandwiched part sandwiched between the body and the cover.

3. The wire harness according to claim 1, wherein
the body of the protector is provided with a positioning piece protruding from a sidewall of the groove toward inner part of the groove, the positioning piece positioning the pair of division bodies.

4. The wire harness according to claim 3, wherein
the positioning piece comprises a pair of pieces protruding from both sidewalls of the groove facing each other.

5. The wire harness according to claim 1, wherein
one of the pair of division bodies is disposed on a bottom plate of the body of the protector to contact the bottom plate, and the other of the pair of division bodies is disposed on the one of the pair of division bodies and contacts the cover when the body and the cover are fitted to each other.

6. A wire harness, comprising:
a plurality of wirings;
a base member keeping the plurality of wirings in a flat state; and
a magnetic core positioned on the base member and covering a target wiring in the plurality of wirings, wherein
the base member is a sheet member having flexibility,
slits are formed on both sides of the target wiring in the sheet member, and
the magnetic core covers a part between the slits in the sheet member together with the target wiring.

7. A wire harness, comprising:
a plurality of wirings;
a base member keeping the plurality of wirings in a flat state; and
a magnetic core positioned on the base member and covering a target wiring in the plurality of wirings, wherein
an apparatus connector connected to a connector of an electrical apparatus and a first harness connector and a second harness connector to which connectors of counterpart wire harnesses are connected, respectively, are provided,
the plurality of wirings include a plurality of apparatus wirings branched from the apparatus connector to be connected to the first harness connector and the second harness connector, and
the target wiring includes a power source wire in the plurality of apparatus wirings.

8. The wire harness according to claim 7, wherein
the base member is a protector including a body in which a groove housing the target wiring is formed and a cover covering the target wiring from a side opposite to the body, and
the magnetic core is housed in the groove.

9. The wire harness according to claim 7, wherein
the electrical apparatus distributes electrical power supplied from a power source of a vehicle,
a first power source wire connecting the first harness connector and the apparatus connector in the power source wire supplies the electrical power from the power source to the electrical apparatus, and
the magnetic core includes a first magnetic core covering the first power source wire.

10. The wire harness according to claim 7, wherein
the electrical apparatus distributes electrical power supplied from a power source of a vehicle,
a second power source wire connecting the second harness connector and the apparatus connector in the power source wire supplies the electrical power from the electrical apparatus to a load of the vehicle, and
the magnetic core includes a second magnetic core covering the second power source wire.

* * * * *